(12) United States Patent
Taylor et al.

(10) Patent No.: US 10,116,115 B2
(45) Date of Patent: Oct. 30, 2018

(54) INTEGRATED CIRCUIT IMPLEMENTING A VCSEL ARRAY OR VCSEL DEVICE

(71) Applicant: INTOP Corp., Wilton, NH (US)

(72) Inventors: Geoff W. Taylor, Wilton, NH (US); Jianhong Cai, Andover, MA (US)

(73) Assignees: Geoff W. Taylor, Wilton, NH (US); Jianhong Cai, Andover, MA (US)

( * ) Notice: Subject to any disclaimer, the term of this patent is extended or adjusted under 35 U.S.C. 154(b) by 0 days.

(21) Appl. No.: 15/439,730

(22) Filed: Feb. 22, 2017

(65) Prior Publication Data

US 2018/0241173 A1 Aug. 23, 2018

(51) Int. Cl.
| | |
|---|---|
| H01S 5/022 | (2006.01) |
| H01L 29/778 | (2006.01) |
| H01S 5/42 | (2006.01) |
| H01S 5/042 | (2006.01) |
| H01S 5/30 | (2006.01) |

(52) U.S. Cl.
CPC ........ *H01S 5/02224* (2013.01); *H01L 29/778* (2013.01); *H01S 5/0425* (2013.01); *H01S 5/3086* (2013.01); *H01S 5/423* (2013.01)

(58) Field of Classification Search
CPC ............................. H01L 29/778; H01S 5/3086
USPC ...................... 372/46.015; 257/197
See application file for complete search history.

(56) References Cited

U.S. PATENT DOCUMENTS

| | | |
|---|---|---|
| 5,241,556 A | 8/1993 | Macomber et al. |
| 6,169,765 B1 | 1/2001 | Holcombe |
| 6,479,844 B2 | 11/2002 | Taylor |
| 6,511,576 B2 | 1/2003 | Klein |
| 6,849,866 B2 | 2/2005 | Taylor |
| 6,936,839 B2 | 8/2005 | Taylor |

(Continued)

OTHER PUBLICATIONS

Determination of the Switching Condition in the Quantum-Well Double-Heterostructure Optoelectronic Switch (DOES), Geoff W. Taylor et al., IEEE Transactions on Electron Devices, vol. 39, No. 11, Nov. 1992, pp. 2529-2540.

(Continued)

*Primary Examiner* — Tuan Nguyen

(74) *Attorney, Agent, or Firm* — Gordon & Jacobson, P.C.

(57) ABSTRACT

A semiconductor device includes an array of VCSEL devices with an annealed oxygen implant region (annealed at a temperature greater than 800° C.) that surrounds and extends laterally between the VCSEL devices. A common anode and a common cathode can be electrically coupled to the VCSEL devices, with the common anode overlying the annealed oxygen implant region. The annealed oxygen implant region can funnel current into active optical regions of the VCSEL devices and provide current isolation between the VCSEL devices while avoiding an isolation etch between VCSEL devices. In another embodiment, a semiconductor device includes an annealed oxygen implant region surrounding a VCSEL device. The VCSEL device(s) can be formed from a multi-junction layer structure where built-in hole charge $Q_p$ for an intermediate p-type layer relative to built-in electron charge $Q_n$ for a bottom n-type layer is configured for diode-like current-voltage characteristics of the VCSEL device(s).

35 Claims, 26 Drawing Sheets

(56) References Cited

U.S. PATENT DOCUMENTS

| | | |
|---|---|---|
| 6,977,954 B2 | 12/2005 | Taylor et al. |
| 7,012,274 B2 | 3/2006 | Taylor |
| 7,026,178 B2 | 4/2006 | Hwang et al. |
| 7,176,046 B2 | 2/2007 | Taylor |
| 7,257,141 B2 | 8/2007 | Chua |
| 7,385,230 B1 | 6/2008 | Taylor |
| 7,551,826 B2 | 6/2009 | Taylor |
| 7,680,164 B1 | 3/2010 | Draper et al. |
| 9,082,637 B2 | 7/2015 | Taylor |
| 9,679,987 B2 | 6/2017 | Taylor |
| 9,698,457 B2 | 7/2017 | Taylor |
| 2003/0091083 A1 | 5/2003 | Hwang et al. |
| 2003/0123512 A1 | 7/2003 | Johnson |
| 2004/0012845 A1* | 1/2004 | Wang ............ H01S 5/423 359/344 |
| 2004/0079954 A1* | 4/2004 | Taylor ............ H01L 29/155 257/89 |
| 2004/0081216 A1* | 4/2004 | Dehmubed ...... H01L 29/155 372/50.124 |
| 2005/0019973 A1 | 1/2005 | Chua |
| 2006/0141651 A1* | 6/2006 | Taylor ............ H03M 1/74 438/47 |
| 2006/0141682 A1* | 6/2006 | Taylor ............ H01L 29/155 438/142 |
| 2007/0269957 A1 | 11/2007 | Cha et al. |
| 2012/0175681 A1 | 7/2012 | Stevens et al. |
| 2013/0272337 A1* | 10/2013 | Tan ............ H01S 5/02284 372/107 |
| 2017/0221995 A1 | 8/2017 | Taylor |
| 2017/0222400 A1 | 8/2017 | Taylor |

OTHER PUBLICATIONS

"Implant Confined 1850nm VCSELs", Matthew M. Dummer et al., available at http://vixarinc.com/pdf/Implant%20Confined%201850nm%20VCSELs.pdf, 2012.

"Single Mode Vertical-Cavity Surface-Emitting Laser Array With High Power and Narrow Far-Field Divergence Angle", Jin-Wei Shi et al., IEEE Photonics Journal, vol. 5, No. 6, Dec. 2013.

Phase 2 Project Summary, downloaded from https://ehb8.gsfc.nasa.gov/sbir/public/documentDownload?contractNum=NNX12CA19C&severFile=216070_04_24_2014_11_27_49.pdf&proposalId=SBIR_10_P2_104273, 2014.

* cited by examiner

Laser Array - 850nm light (GaAs QW) (1 Lamda Upper Cavity)

| Layer ID | material | type | doping | thickness (A) | |
|---|---|---|---|---|---|
| 445 | GaAs | UD | | 100 | ↑ |
| 443 | Al(0.05)Ga(0.95)As | UD | | 300 | |
| 441 | GaAs | P++ | 1E20 | 200 | |
| 439 | Al(0.05)Ga(0.95)As | P++ | 1E20 | 400 | |
| 437 | Al(0.05)Ga(0.95)As | P++ | 7E18 | 533 | 1 lamda |
| 435 | GaAs | P++ | 7E18 | 12 | |
| 433 | AlAs | P++ | 7E18 | 600 | |
| 431 | GaAs | P++ | 7E18 | 12 | |
| 429 | Al(0.3)Ga(0.7)As | P++ | 7E18 | 80 | |
| 427 | Al(0.3)Ga(0.7)As | UD | | 300 | |
| 425 | Al(0.3)Ga(0.7)As | N+ | 3.5E18 | 80 | |
| 423 | Al(0.3)Ga(0.7)As | UD | | 30 | ↓ |
| 421 | GaAs } x 3 | UD | | 90 | ↑ |
| 419 | Al(0.2)Ga(0.8)As } x 3 | UD | | 100 | |
| 417 | Al(0.2)Ga(0.8)As | UD | | 3841 | |
| 415 | Al(0.2)Ga(0.8)As } x 3 | p | 1.00E+18 | 500 | |
| 413 | Al(0.3)Ga(0.7)As | N+ | 3.5E18 | 1000 | N lamda/2 |
| 411 | Al(0.05)Ga(0.95)As | N+ | 3.5E18 | 2446 | |
| 409 | Al(0.05)Ga(0.95)As | UD | | 200 | |
| 407 | AlAs | | | 1476 | |
| 405 | Al(0.15)Ga(0.85)As } x 5 | | | 609 | |
| 403 | AlAs } x 5 | | | 1476 | ↓ |
| 401 | GaAs Substrate | SI | | | |

FIG. 4

Laser Array - 850nm light (InGaAs QW) (1 Lamda Upper Cavity)

| Layer ID | material | type | doping | thickness (A) | |
|---|---|---|---|---|---|
| 645 | GaAs | UD | | 10 | |
| 643 | Al(0.05)Ga(0.95)As | UD | | 540 | |
| 641 | GaAs | P++ | 1E20 | 200 | |
| 639 | Al(0.05)Ga(0.95)As | P++ | 1E20 | 350 | |
| 637 | Al(0.05)Ga(0.95)As | P++ | 7E18 | 386 | |
| 635 | GaAs | P++ | 7E18 | 12 | 1 lamda |
| 633 | AlAs | P++ | 7E18 | 600 | |
| 631 | GaAs | P++ | 7E18 | 12 | |
| 629 | Al(0.3)Ga(0.7)As | UD | | 80 | |
| 627 | Al(0.3)Ga(0.7)As | UD | | 300 | |
| 625 | Al(0.3)Ga(0.7)As | N+ | 3.5E18 | 80 | |
| 623 | Al(0.3)Ga(0.7)As | UD | | 30 | |
| 621 | In(0.06)Ga(0.95As ) x 3 | UD | | 75 | |
| 619 | Al(0.2)Ga(0.8)As ) x 3 | UD | | 100 | |
| 617 | Al(0.2)Ga(0.8)As | UD | | 3841 | |
| 615 | Al(0.2)Ga(0.8)As ) x 3 | p | 1.00E+18 | 500 | N lamda/2 |
| 613 | Al(0.3)Ga(0.7)As | N+ | 3.5E18 | 1000 | |
| 611 | Al(0.05)Ga(0.95)As | N+ | 3.5E18 | 2446 | |
| 609 | Al(0.05)Ga(0.95)As | UD | | 200 | |
| 607 | AlAs | | | 1476 | |
| 605 | Al(0.15)Ga(0.85)As ) x 5 | | | 609 | |
| 603 | AlAs ) x 5 | | | 1476 | |
| 601 | GaAs Substrate | SI | | | |

FIG. 6

Laser Array - 850nm light (GaAs QW) (1/2 Lamda Upper Cavity)

| Layer ID | material | type | doping | thickness (A) | |
|---|---|---|---|---|---|
| 745 | GaAs | UD | | 10 | |
| 743 | Al(0.05)Ga(0.95)As | UD | | 440 | |
| 741 | GaAs | P++ | 1E20 | 200 | |
| 735 | GaAs | P++ | 7E18 | 10 | |
| 733 | AlAs | P++ | 7E18 | 400 | |
| 731 | GaAs | P++ | 7E18 | 10 | |
| 729 | Al(0.3)Ga(0.7)As | P++ | 7E18 | 50 | 1/2 lamda |
| 727 | Al(0.3)Ga(0.7)As | UD | | 250 | |
| 725 | Al(0.3)Ga(0.7)As | N+ | 3.5E18 | 50 | |
| 723 | Al(0.3)Ga(0.7)As | UD | | 30 | |
| 721 | GaAs ) x 3 | UD | | 90 | |
| 719 | Al(0.2)Ga(0.8)As ) x 3 | UD | | 100 | |
| 717 | Al(0.2)Ga(0.8)As | UD | | 3841 | |
| 715 | Al(0.2)Ga(0.8)As | p | 1.00E+18 | 500 | |
| 713 | Al(0.3)Ga(0.7)As | N+ | 3.5E18 | 1000 | N lamda/2 |
| 711 | Al(0.05)Ga(0.95)As | N+ | 3.5E18 | 2446 | |
| 709 | Al(0.05)Ga(0.95)As | UD | | 200 | |
| 707 | AlAs | | | 1476 | |
| 705 | Al(0.15)Ga(0.85)As ) x 5 | | | 609 | |
| 703 | AlAs ) x 5 | | | 1476 | |
| 701 | GaAs Substrate | SI | | | |

FIG. 7

Laser Array - 980nm light (InGaAs QW) (1 Lamda Upper Cavity)

| Layer ID | material | type | doping | thickness (Å) |
|---|---|---|---|---|
| 845 | GaAs | UD | | 300 |
| 841 | GaAs | P++ | 1E20 | 600 |
| 837e | GaAs | P++ | 7E18 | 658 |
| 837d | GaAs | P++ | 7E18 | 6 |
| 837c | Al(0.7)Ga(0.3)As | P++ | 7E18 | 10 |
| 837b | Al(0.7)Ga(0.3)As | P | 5E17 | 960 |
| 837a | Al(0.7)Ga(0.3)As | P++ | 7E18 | 10 |
| 831 | GaAs | P++ | 7E18 | 12 |
| 829 | Al(0.15)Ga(0.85)As | P++ | 7E18 | 80 |
| 827 | Al(0.15)Ga(0.85)As | UD | | 300 |
| 825 | Al(0.15)Ga(0.85)As | N+ | 3.5E18 | 80 |
| 823b | Al(0.15)Ga(0.85)As | UD | | 30 |
| 823a | GaAs | UD | | 15 |
| 821 | In(0.2)Ga(0.8)As } x 3 | UD | | 60 |
| 819 | GaAs } x 3 | UD | | 100 |
| 817d | GaAs | UD | | 400 |
| 817c | Al(0.15)Ga(0.85)As | UD | | 2170 |
| 817b | GaAs | UD | | 20 |
| 817a | Al(0.15)Ga(0.85)As | UD | | 2170 |
| 815 | Al(0.15)Ga(0.85)As | p | 1.00E+18 | 500 |
| 813 | Al(0.4)Ga(0.4)As | N+ | 3.5E18 | 1000 |
| 811 | GaAs | N+ | 3.5E18 | 2881 |
| 807 | AlAs | | | 845 |
| 805 | GaAs } x 27 | | | 710 |
| 803 | AlAs } x 27 | | | 845 |
| 801 | GaAs Substrate | SI | | |

1 lamda / N lamda/2

FIG. 8

Laser Array - 980nm light (InGaAs QW) (1/2 Lamda Upper Cavity)

| Layer ID | material | type | doping | thickness (A) |
|---|---|---|---|---|
| 945 | GaAs | UD | | 200 |
| 941 | GaAs | P++ | 1E20 | 200 |
| 937b | GaAs | P++ | 7E18 | 10 |
| 937a | Al(0.7)Ga(0.3)As | P++ | 7E18 | 600 |
| 931 | GaAs | P++ | 7E18 | 10 |
| 929 | Al(0.15)Ga(0.85)As | P++ | 7E18 | 80 |
| 927 | Al(0.15)Ga(0.85)As | UD | | 300 |
| 925 | Al(0.15)Ga(0.85)As | N+ | 3.5E18 | 80 |
| 923b | Al(0.15)Ga(0.85)As | UD | | 30 |
| 923a | GaAs | UD | | 15 |
| 921 | In(0.2)Ga(0.8)As } x 3 | UD | | 60 |
| 919 | GaAs } x 3 | UD | | 100 |
| 917d | GaAs | UD | | 400 |
| 917c | Al(0.15)Ga(0.85)As | UD | | 2170 |
| 917b | GaAs | UD | | 20 |
| 917a | Al(0.15)Ga(0.85)As | p | 1.00E+18 | 2170 |
| 915 | Al(0.15)Ga(0.85)As | N+ | 3.5E18 | 500 |
| 913 | Al(0.4)Ga(0.4)As | N+ | 3.5E18 | 1000 |
| 911 | GaAs | | | 2881 |
| 907 | AlAs | | | 845 |
| 905 | GaAs } x 27 | | | 710 |
| 903 | Al(As) } x 27 | | | 845 |
| 901 | GaAs Substrate | SI | | |

Upper bracket: 1/2 lamda
Lower bracket: N lamda/2

FIG. 9

Laser Array - 980nm light (InGaAs QW) (1 Lamda Upper Cavity)

| Layer ID | material | type | doping | thickness (A) |
|---|---|---|---|---|
| 1045 | GaAs | UD | | 300 |
| 1041 | GaAs | P++ | 1E20 | 600 |
| 1037e | GaAs | P++ | 7E18 | 858 |
| 1037d | GaAs | P++ | 7E18 | 6 |
| 1037c | Al(0.7)Ga(0.3)As | P++ | 7E18 | 10 |
| 1037b | Al(0.7)Ga(0.3)As | P | 5E17 | 960 |
| 1037a | Al(0.7)Ga(0.3)As | P++ | 7E18 | 10 |
| 1031 | GaAs | P++ | 7E18 | 12 |
| 1029 | Al(0.15)Ga(0.85)As | P++ | 7E18 | 80 |
| 1027 | Al(0.15)Ga(0.85)As | | | 300 |
| 1025 | Al(0.15)Ga(0.85)As | N+ | 3.5E18 | 80 |
| 1023b | Al(0.15)Ga(0.85)As | UD | | 30 |
| 1023a | GaAs | UD | | 15 |
| 1021 | In(0.2)Ga(0.8)As ) x 3 | UD | | 60 |
| 1019 | GaAs ) x 3 | UD | | 100 |
| 1018c | GaAs | UD | | 400 |
| 1018b | Al(0.15)Ga(0.85)As | UD | | 2170 |
| 1018a | GaAs | UD | | 20 |
| 1017 | Al(0.15)Ga(0.85)As | UD | | 2170 |
| 1015f | GaAs | UD | | 400 |
| 1015e | GaAs ) x 3 | UD | | 100 |
| 1015d | In(0.2)Ga(0.8)As ) x 3 | UD | | 60 |
| 1015c | GaAs | UD | | 15 |
| 1015b | Al(0.15)Ga(0.85)As | UD | | 60 |
| 1015a | Al(0.15)Ga(0.85)As | P+ | 7E18 | 25 |
| 1014 | Al(0.15)Ga(0.85)As | UD | | 300 |
| 1013e | Al(0.15)Ga(0.85)As | N+ | 3.5E18 (1) | 80 |
| 1013d | GaAs | N+ | 3.5E18 | 12 |
| 1013c | Al(0.15)Ga(0.85)As | N+ | 3.5E18 | 20 |
| 1013b | GaAs | N+ | 3.5E18 | 12 |
| 1013a | Al(0.7)Ga(0.3)As | N+ | 3.5E18 (2) | 1000 |
| 1011 | GaAs | N+ | 3.5E18 | 2881 |
| 1009 | GaAs | UD | | 200 |
| 1007 | AlAs | | | 845 |
| 1005 | GaAs ) x 27 | | | 710 |
| 1003 | AlAs ) x 27 | | | 845 |
| 1001 | GaAs Substrate | SI | | |

1 lamda (upper portion), N lamda/2 (lower portion)

FIG. 10

INTEGRATED CIRCUIT IMPLEMENTING A VCSEL ARRAY OR VCSEL DEVICE

BACKGROUND

1. Field

The present disclosure relates to semiconductor integrated circuits that implement vertical-cavity surface-emitting laser (VCSEL) devices as well as fabrications methods for such integrated circuits.

2. State of the Art

A vertical-cavity surface-emitting laser, or VCSEL, is a type of semiconductor integrated circuit with laser beam emission perpendicular from the top surface, contrary to conventional edge-emitting semiconductor lasers (also in-plane lasers) which emit from surfaces formed by cleaving the individual chip out of a wafer.

Integrated circuits that implement an array of VCSEL devices have been demonstrated. For example, Shi et al. "Single-Mode Vertical-Cavity Surface-Emitting Laser Array with High Power and Narrow Far-Field Divergence Angle," IEEE Photonics journal, Vol. 5, No. 6, December 2013, describes an 850 nm VCSEL array that implements 6×6 VCSEL devices. Such a VCSEL array provides for high output power with a single-lobe (spot) output and low divergence angle in the far field, and are much desired for several applications, such as light detecting and ranging (LIDAR) systems, free space optical interconnects, and others.

The epitaxial layer structure used for such VCSEL arrays typically includes an active optical region that realizes one or more quantum wells located between a top p-type contact and a bottom n-type contact. A current confinement region is formed adjacent to the top p-type contact by diffusion or ion implantation of n-type species (such as silicon). Current is directed from the top p-type contact into and through the current confinement region (or gain region) to an oxide-confined aperture formed below the current confinement region and above the quantum well active optical region. The oxide-confined aperture provides for current confinement as well as waveguide cladding and optical confinement that supports the vertical propagation mode of light produced by the VCSEL. The oxide-confined aperture is typically formed by lateral oxidation or implantation of oxygen that causes local damage to the epitaxial layer structure. An isolation etch between VCSEL devices provides for current isolation between the VCSEL devices. The epitaxial layer structure supports operation as a two-terminal semiconductor laser diode that conducts primarily in one direction (asymmetric conductance) from the p-type contact to the n-type contact with low resistance to the flow of current in this one direction, and with high resistance in the other direction from the n-type contact to the p-type contact.

Furthermore, the epitaxial layer structure of the two-dimensional VCSEL array does not allow for efficient integration of other electronic devices, such as high performance transistors, as part of the integrated circuit. Instead, transistor devices are typically implemented by a separate and distinct integrated circuit.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In accordance with some examples, a semiconductor device is provided that includes a plurality of vertical-cavity surface-emitting laser (VCSEL) devices arranged in a two-dimensional array with an annealed oxygen implant region that surrounds and extends laterally in a continuous manner between the plurality of VCSEL devices. The annealed oxygen implant region is annealed at a temperature greater than 800° C. The semiconductor device can further include a common anode and a common cathode that are electrically coupled to the plurality of VCSEL devices. The common anode can overlie the annealed oxygen implant region.

Furthermore, the plurality of VCSEL devices can have respective active optical regions, and the annealed oxygen implant region can provide a high resistance region that confines and funnels current into the respective active optical regions of the plurality of VCSEL devices. The annealed oxygen implant region can also provide current isolation between the plurality of VCSEL devices while avoiding an isolation etch between the plurality of VCSEL devices. The annealed oxygen implant region can also provide refractive index changes that aid in lateral confinement of light within vertical resonant cavities of the plurality of VCSEL devices.

The semiconductor device can further include an annealed n-type ion implant that overlies the annealed oxygen implant region and surrounds and extends laterally in a continuous manner between the plurality of VCSEL devices of the array. The annealed n-type ion implant and the annealed oxygen implant region can be defined using a common implant mask. The annealed n-type ion implant region can confine and funnel current into the respective active optical regions of the plurality of VCSEL devices. The annealed n-type ion implant region can also provide current isolation between the plurality of VCSEL devices while avoiding an isolation etch between the plurality of VCSEL devices. The annealed n-type ion implant region can also provide refractive index changes that aid in lateral confinement of light within vertical resonant cavities of the plurality of VCSEL devices.

In embodiments, the plurality of VCSEL devices can be formed from a layer structure that includes at least one bottom n-type layer, at least one intermediate p-type layer formed above the at least one bottom n-type layer, an n-type modulation doped quantum well structure formed above the at least one intermediate p-type layer, at least one undoped spacer layer formed between the at least one intermediate p-type layer and the n-type modulation doped quantum well structure, and at least one top p-type layer formed above the n-type modulation doped quantum well structure. The common anode can contact that at least one top p-type layer. The common cathode can contact the at least one bottom n-type layer. The n-type modulation doped quantum well structure includes an n-type charge sheet offset from at least one quantum well, and the n-type modulation doped quantum well structure can define respective active optical regions for the plurality of VCSEL devices. The annealed oxygen implant region can be disposed vertically in the layer structure within the at least one undoped spacer layer.

In embodiments, the at least one intermediate p-type layer has a built-in hole charge $Q_p$ which is dictated by at least one of p-type dopant concentration and thickness of the at least one intermediate p-type layer. The at least one bottom n-type layer has a built-in electron charge $Q_n$ which is dictated by at least one of n-type dopant concentration and thickness of the least one bottom n-type layer. The built-in hole charge $Q_p$ relative to the built-in electron charge $Q_n$ can be configured for diode-like current-voltage characteristics of the plurality of VCSEL devices.

The plurality of layers can be formed on a substrate. The plurality of layers can include a plurality of bottom mirror layers formed on the substrate below the at least one bottom n-type layer, wherein the bottom mirror layers define resonant cavities for the plurality of VCSEL devices. The bottom mirror layers can be formed from aluminum arsenide (AlAs) that is subjected to oxidation that converts the aluminum arsenide (AlAs) to aluminum oxide ($Al_xO_y$). The resonant cavities for the plurality of VCSEL devices can be further defined by a plurality of top mirror layers formed by deposition.

In embodiments, the plurality of layers can include at least one undoped spacer layer formed above the top p-type layer that is used to define respective apertures for the plurality of VCSEL devices. Metal that forms the common anode as well as the at least one undoped spacer layer formed above the top p-type layer can be etched away as part of an etch operation that defines the respective apertures for the plurality of VCSEL devices.

In embodiments, the lateral spacing between the apertures of the plurality of VCSEL devices of the array can be 3 μm or less. Furthermore, the plurality of VCSEL devices of the array can experience mode-coupling that produces a coherent single mode output with continuous wave (CW) operation. The coherent single mode output can have a dominant single lobe far field pattern.

In another example, a semiconductor device is provided that includes at least one vertical-cavity surface-emitting laser (VCSEL) device with an annealed oxygen implant region that surrounds the VCSEL device. The annealed oxygen implant region is annealed at a temperature greater than 800° C. The semiconductor device can further include an anode and a cathode that are electrically coupled to the VCSEL device. The anode can overlie the annealed oxygen implant region.

Furthermore, the VCSEL device can have an active optical region, and the annealed oxygen implant region can provide a high resistance region that confines and funnels current into the active optical region of the VCSEL device. The annealed oxygen implant region can also provide a refractive index change that aids in lateral confinement of light within vertical resonant cavity of the VCSEL device.

The semiconductor device can further include an annealed n-type ion implant that overlies the annealed oxygen implant region and surrounds the VCSEL device. The annealed n-type ion implant and the annealed oxygen implant region can be defined using a common implant mask. The annealed n-type ion implant region can confine and funnel current into the active optical region of the VCSEL device. The annealed n-type ion implant region can also provide a refractive index change that aids in lateral confinement of light within the vertical resonant cavity of the VCSEL device.

In embodiments, the VCSEL device can be formed from a layer structure that includes at least one bottom n-type layer, at least one intermediate p-type layer formed above the at least one bottom n-type layer, an n-type modulation doped quantum well structure formed above the at least one intermediate p-type layer, at least one undoped spacer layer formed between the at least one intermediate p-type layer and the n-type modulation doped quantum well structure, and at least one top p-type layer formed above the n-type modulation doped quantum well structure. The anode can contact that at least one top p-type layer. The cathode can contact the at least one bottom n-type layer. The n-type modulation doped quantum well structure includes an n-type charge sheet offset from at least one quantum well, and the n-type modulation doped quantum well structure can define the active optical region for the VCSEL device. The annealed oxygen implant region can be disposed vertically in the layer structure within the at least one undoped spacer layer.

In embodiments, the at least one intermediate p-type layer has a built-in hole charge $Q_p$ which is dictated by at least one of p-type dopant concentration and thickness of the at least one intermediate p-type layer. The at least one bottom n-type layer has a built-in electron charge $Q_n$ which is dictated by at least one of n-type dopant concentration and thickness of the least one bottom n-type layer. The built-in hole charge $Q_p$ relative to the built-in electron charge $Q_n$ can be configured for diode-like current-voltage characteristics of the VCSEL device.

The plurality of layers can be formed on a substrate. The plurality of layers can include a plurality of bottom mirror layers formed on the substrate below the at least one bottom n-type layer, wherein the bottom mirror layers define a resonant cavity for the VCSEL device. The bottom mirror layers can be formed from aluminum arsenide (AlAs) that is subjected to oxidation that converts the aluminum arsenide (AlAs) to aluminum oxide ($Al_xO_y$). The resonant cavity for the VCSEL device can be further defined by a plurality of top mirror layers formed by deposition.

In embodiments, the plurality of layers can include at least one undoped spacer layer formed above the top p-type layer that is used to define an aperture for the VCSEL device. Metal that forms the anode as well as the at least one undoped spacer layer formed above the top p-type layer can be etched away as part of an etch operation that defines the aperture for the VCSEL device.

In embodiments, the VCSEL device can produce a coherent single mode output with continuous wave (CW) operation.

In embodiments, electronic circuitry (such as at least one of an n-channel HFET device, an inverted P-type FET device, and a p-channel HFET device) can be integrally formed with the array of VCSEL devices or VCSEL device.

BRIEF DESCRIPTION OF THE DRAWINGS

FIG. 4 is a table illustrating an exemplary layer structure that can be used to implement an integrated circuit that includes an array of VCSEL devices that emit light at a characteristic wavelength of 850 nm.

FIG. 6 is a table illustrating another exemplary layer structure that can be used to implement an integrated circuit that includes an array of VCSEL devices that emit light at a characteristic wavelength of 850 nm.

FIG. 7 is a table illustrating still another exemplary layer structure that can be used to implement an integrated circuit that includes an array of VCSEL devices that emit light at a characteristic wavelength of 850 nm.

FIG. 8 is a table illustrating an exemplary layer structure that can be used to implement an integrated circuit that includes an array of VCSEL devices that emit light at a characteristic wavelength of 980 nm.

FIG. 9 is a table illustrating another exemplary layer structure that can be used to implement an integrated circuit that includes an array of VCSEL devices that emit light at a characteristic wavelength of 980 nm.

FIG. 10 is a table illustrating still another exemplary layer structure that can be used to implement an integrated circuit that includes an array of VCSEL devices that emit light at a characteristic wavelength of 980 nm.

DETAILED DESCRIPTION OF THE PREFERRED EMBODIMENTS

Figure 1:
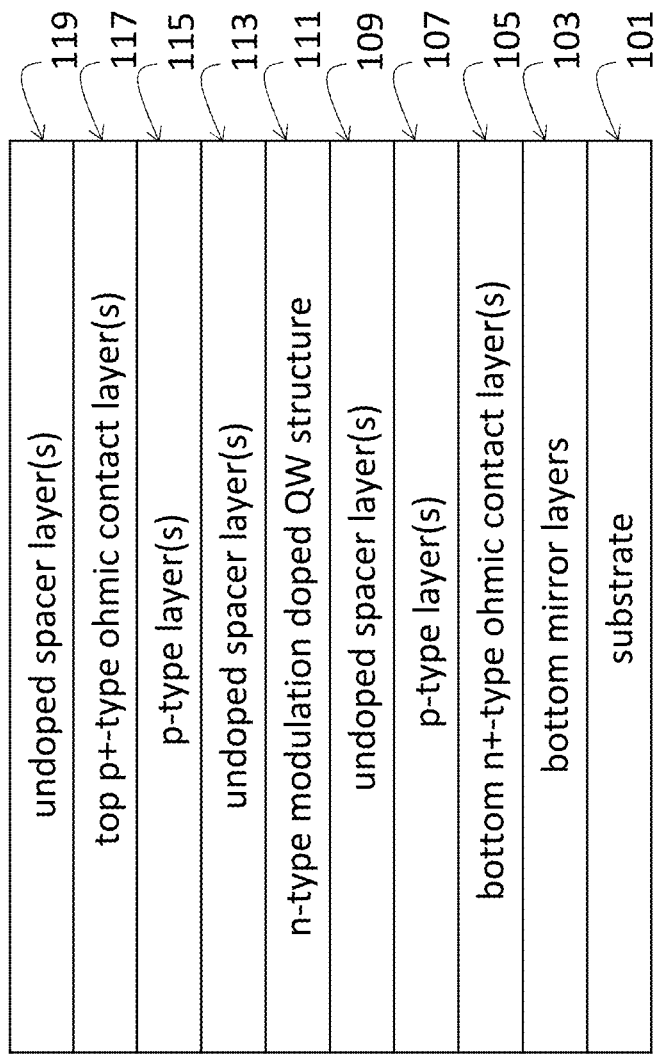
FIG. 1 is a schematic illustration of an exemplary layer structure that can be used to implement the integrated circuit devices of the present disclosure.

Turning now to FIG. 1, the device structure of the present disclosure includes bottom mirror layers 103 formed on substrate 101. The bottom mirror layers 103 are typically formed by depositing pairs of semiconductor or dielectric materials with different refractive indices to form a distributed Bragg reflector (DBR) mirror. When two materials with different refractive indices are placed together to form a junction, light will be reflected at the junction. The amount of light reflected at one such boundary is small. However, if multiple junctions/layer pairs are stacked periodically with each layer having a quarter-wave ($\lambda/4$) optical thickness, the reflections from each of the boundaries will be added in phase to produce a large amount of reflected light (e.g., a large reflection coefficient) at the particular center wavelength $\lambda_C$. Deposited upon the bottom mirror layers 103 is an active device structure suitable for realizing a two-dimensional array of VCSEL devices as well as transistor devices as part of a monolithic integrated circuit.

The active device structure includes one or more bottom n+-type ohmic contact layers 105 formed above the bottom mirror layers 103. One or more p-type layers 107 are formed above the n+-type ohmic contact layer(s) 105. One or more undoped spacer layers 109 are formed above the p-type layer(s) 107. An n-type modulation doped quantum well (QW) structure 111 is formed above the undoped spacer layer(s) 109. The n-type modulation doped QW structure 111 includes a thin n+ doped charge sheet formed above one or more quantum wells (QWs) with an undoped spacer layer therebetween. One or more undoped spacer layers 113 are formed above the n-type modulation doped QW structure 111. One or more p-type layers 115 are formed above the undoped spacer layer(s) 113. One or more p+-type doped ohmic contact layer(s) 117 are formed above the p-type cladding layer(s) 115. And one or more undoped spacer layers 119 are formed above the p+-type ohmic contact layer(s) 117 as shown.

The epitaxial layer structure that encompasses the bottom n+-type ohmic contact layer(s) 105, the intermediate p-type layer(s) 107, the intermediate n-type modulation doped QW structure 111 and the top p-type layers 117, 119 can be used to define a two-dimensional array of VCSEL devices as described herein.

Furthermore, the n-type modulation doped QW structure 111 with a p-type gate region formed from the p-type layer(s) 115, 117 can be used to define an n-channel HFET transistor as described herein. The undoped spacer layer(s) 109 under the n-type modulation doped QW structure 111 can be used to define the back-gate (or collector) of the n-channel HFET transistor.

Furthermore, an n-type gate formed from the bottom n+-type ohmic contact layer(s) 105 below the p-type layer(s) 107 can be used to define an inverted p-type FET transistor as described herein. The undoped spacer layer(s) 109 above the p-type layer(s) 107 can be used to define the back-gate (or collector) of the inverted p-type FET transistor.

The bottom n+-type ohmic contact layer(s) 105 enables the formation of ohmic contacts thereto for the bottom cathode metal of the VCSEL devices, and can also serve electrically as part of the bottom gate region of the inverted p-type FET transistor. The intermediate p-type layer(s) can serve electrically as part of the channel of the inverted p-type FET transistor.

The undoped spacer layer(s) 109 can serve electrically as the back-gate (collector) region for the n-channel HFET as well as the back-gate (collector) region for the inverted p-type FET.

The n-type modulation doped QW structure 111 is formed on the spacer layer(s) 109. The n-type modulation doped QW structure 111 includes a thin n+-type charge sheet offset from one or more quantum wells (QWs) by one or more undoped spacer layers. The n+-type charge sheet is formed last above the undoped spacer layer(s) of the n-type modulation doped QW structure 111. The n-type modulation doped QW structure 111 can serve as the active optical region of the of the VCSEL devices. The n-type modulation doped QW structure 111 can also serve electrically as part of the channel of the n-channel HFET device.

The p-type layer(s) 115 and the top p+-type ohmic contact layer(s) 117 form the top p-type region for the layer structure of the VCSEL devices, and can also serve electrically as part of the gate region for the n-channel HFET.

Figure 2A:
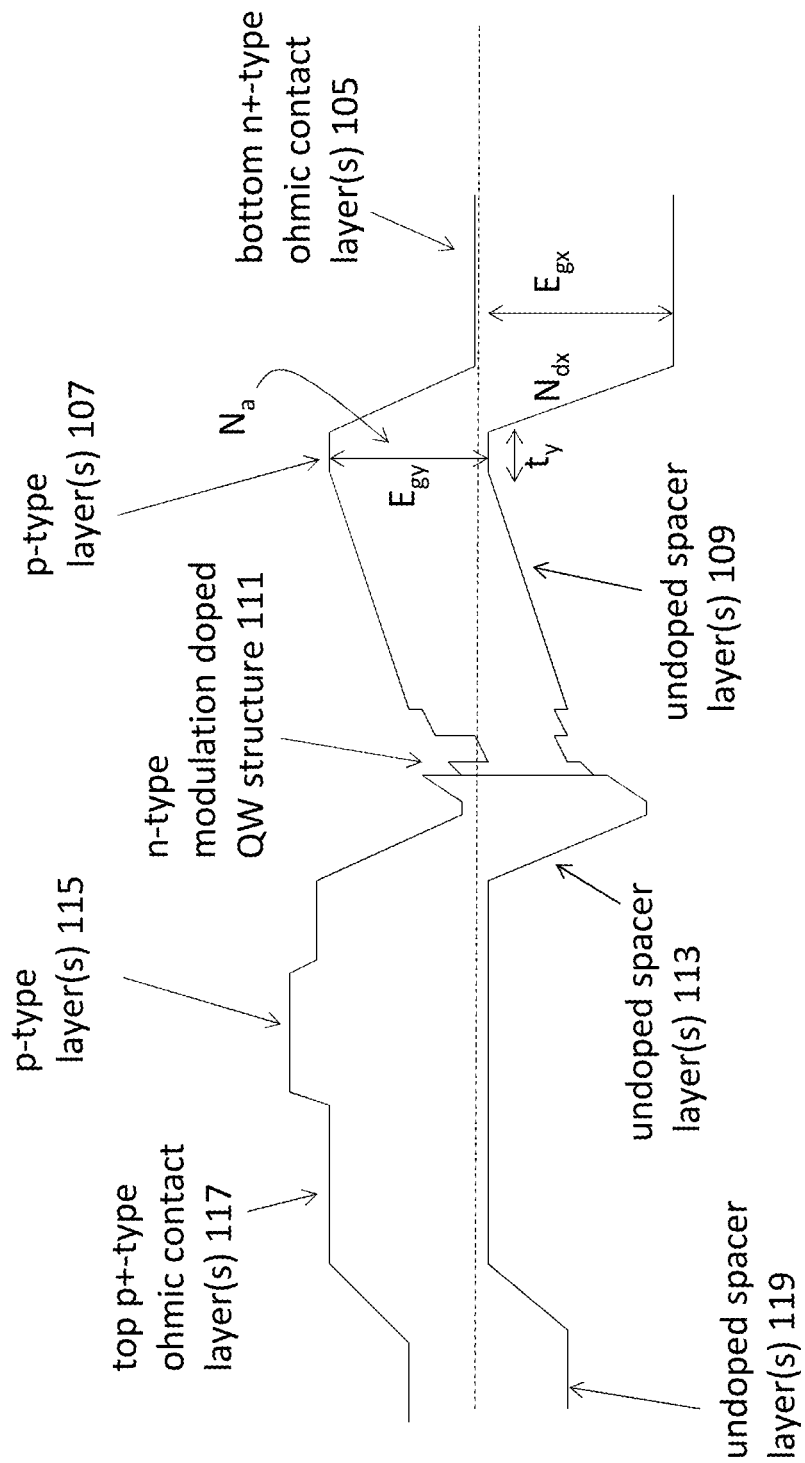
FIG. 2A is an illustrative energy band diagram for the layer structure of FIG. 1.
Figure 2B:
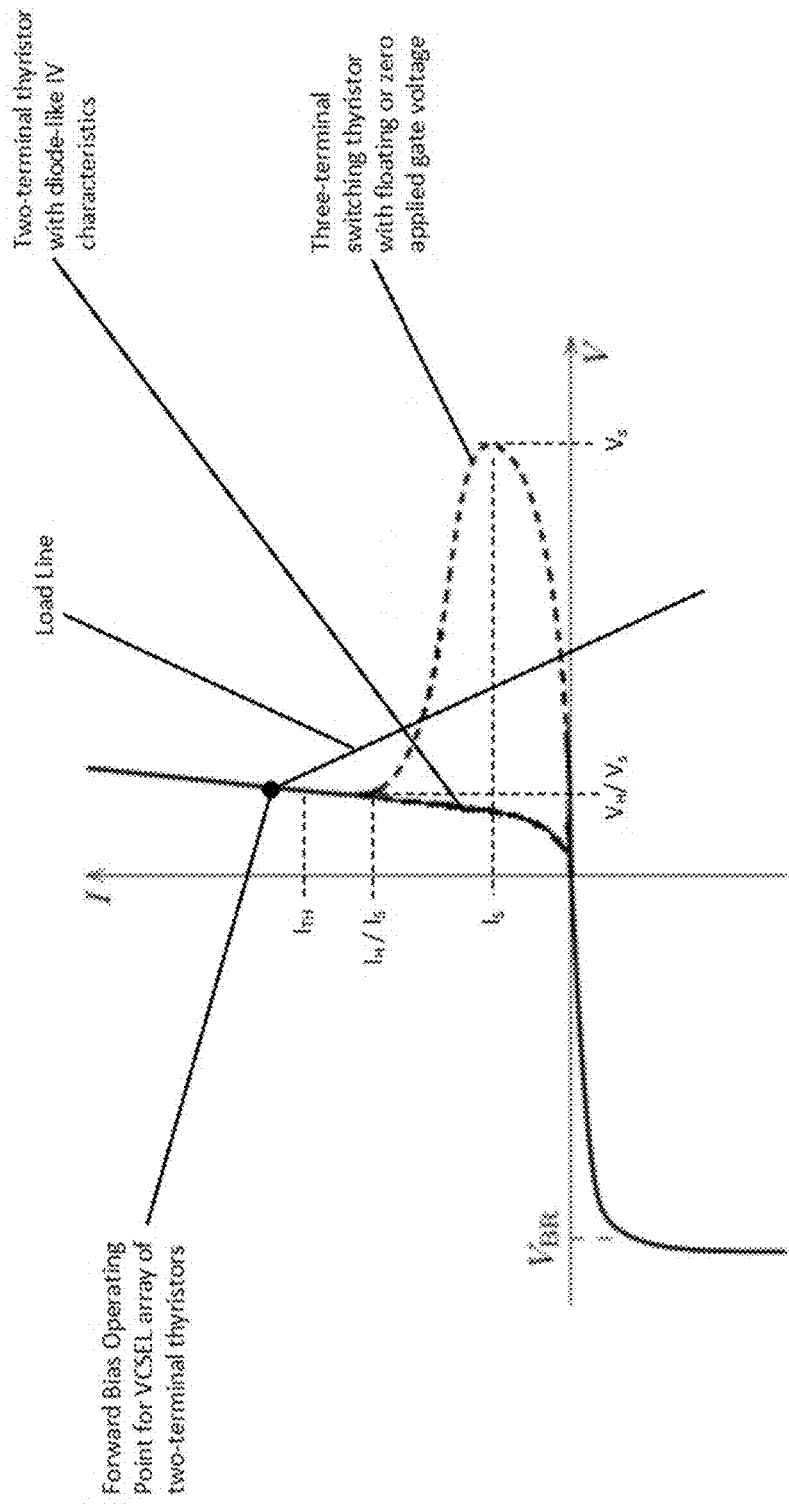
FIG. 2B is a current-voltage diagram illustrating the forward bias operating point for the VCSEL devices of a VCSEL array realized from the layer structure of FIG. 1; it also shows the current-voltage characteristics of a conventional three-terminal switching thyristor with floating or zero applied gate voltage.

FIG. 2A is an illustrative energy band diagram of the layer structure of FIG. 1. Note that the built-in hole charge $Q_p$ of the intermediate p-type layer(s) 107 (which is dictated by the p-type dopant concentration and/or thickness of the intermediate p-type layer(s) 107) relative to the built-in electron charge $Q_n$ of the bottom n+-type ohmic contact layer(s) 105 (which is dictated by the n-type dopant concentration and/or thickness of the bottom n+-type ohmic contact layer(s) 105) can be configured such that respective VCSEL devices can operate as two-terminal devices in a forward-biased mode (forward-biased operation) with diode-like current-voltage characteristics as shown in FIG. 2B. Such forward-biased operation with diode-like current-voltage characteristics avoids thyristor switching and holding action at voltages $V_s$ and $V_h$ that is found with conventional three-terminal thyristor devices with zero of floating applied gate voltage as shown in FIG. 2B. Such thyristor switching behavior, if present, could result in an unwanted winner take all situation due to small variations in the switching voltage and current for the different thyristor VCSEL devices. Specifically, the first thyristor VCSEL device that switches into its ON state could possibly draw all of the available current and thus prevent the other thyristor VCSEL devices from switching ON and contributing to the light output of the array.

Figure 2C:
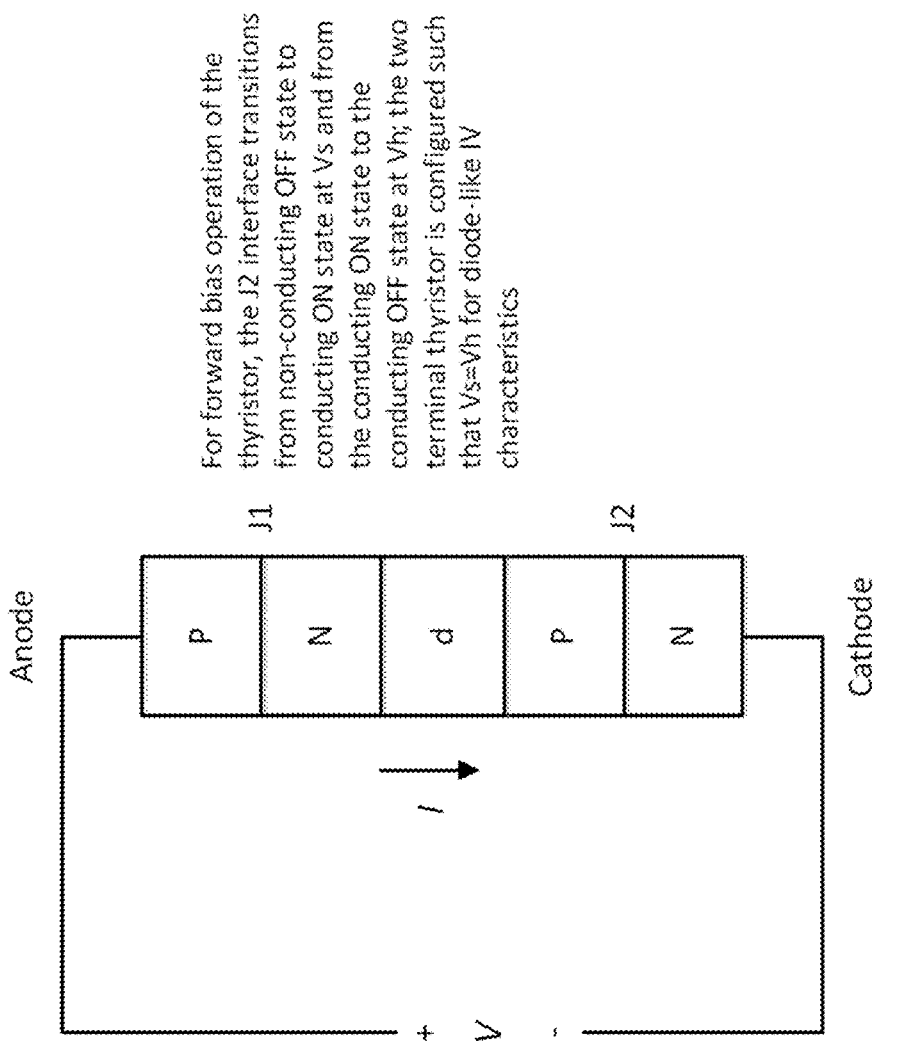
FIG. 2C is a schematic diagram of the respective VCSEL devices of a VCSEL array realized from the layer structure of FIG. 1, with notes that describe the configuration of the respective VCSEL devices for diode-like current-voltage characteristics.

From a logical viewpoint, the voltage drop across each two-terminal VCSEL device in the forward-biased operation is the sum of the voltages across two junctions J1 and J2 with an undoped spacer region D between the J1 and J2 junctions as shown in FIG. 2C. The J1 junction is the junction between the top p-type region (layers 117, 115) and the intermediate n-type modulation doped QW structure 111. The J2 junction is the junction between the intermediate p-type layer(s) 107 and the bottom n+-type ohmic contact layer(s) 105. The D region is the undoped spacer layer(s) 109. For the forward bias operation, the J2 junction transitions from a non-conducting OFF state to a conducting ON state at the switching voltage $V_s$ and from the conducting ON state to the non-conducting OFF state at the holding voltage $V_h$. The intermediate p-type layer(s) 107 of the J2 junction has a built-in hole charge $Q_p$, which is dictated by the p-type dopant concentration and/or thickness of the intermediate p-type layer(s) 107. The bottom n+-type ohmic contact layer(s) 105 of the J2 junction has a built-in electron charge $Q_n$, which is dictated by the n-type dopant concentration and/or thickness of the bottom n+-type ohmic contact layer(s) 105. The built-in hole charge $Q_p$ relative to the built-in electron charge $Q_n$ of the J2 junction can be configured such that the switching voltage $V_s$ is equal to the holding voltage $V_h$ for diode-like current-voltage characteristics of the VCSEL device. In essence, the switching voltage $V_s$ and holding voltage $V_h$ collapse to a single voltage (labeled "$V_s/V_h$" in FIG. 2B) such that the VCSEL device turns ON as a diode when subject to predefined total forward bias (which, for example, can be 1.5 volts or less). In the ON state, the VCSEL device conducts current from the anode to the cathode as noted in FIG. 2C.

Figure 3A:
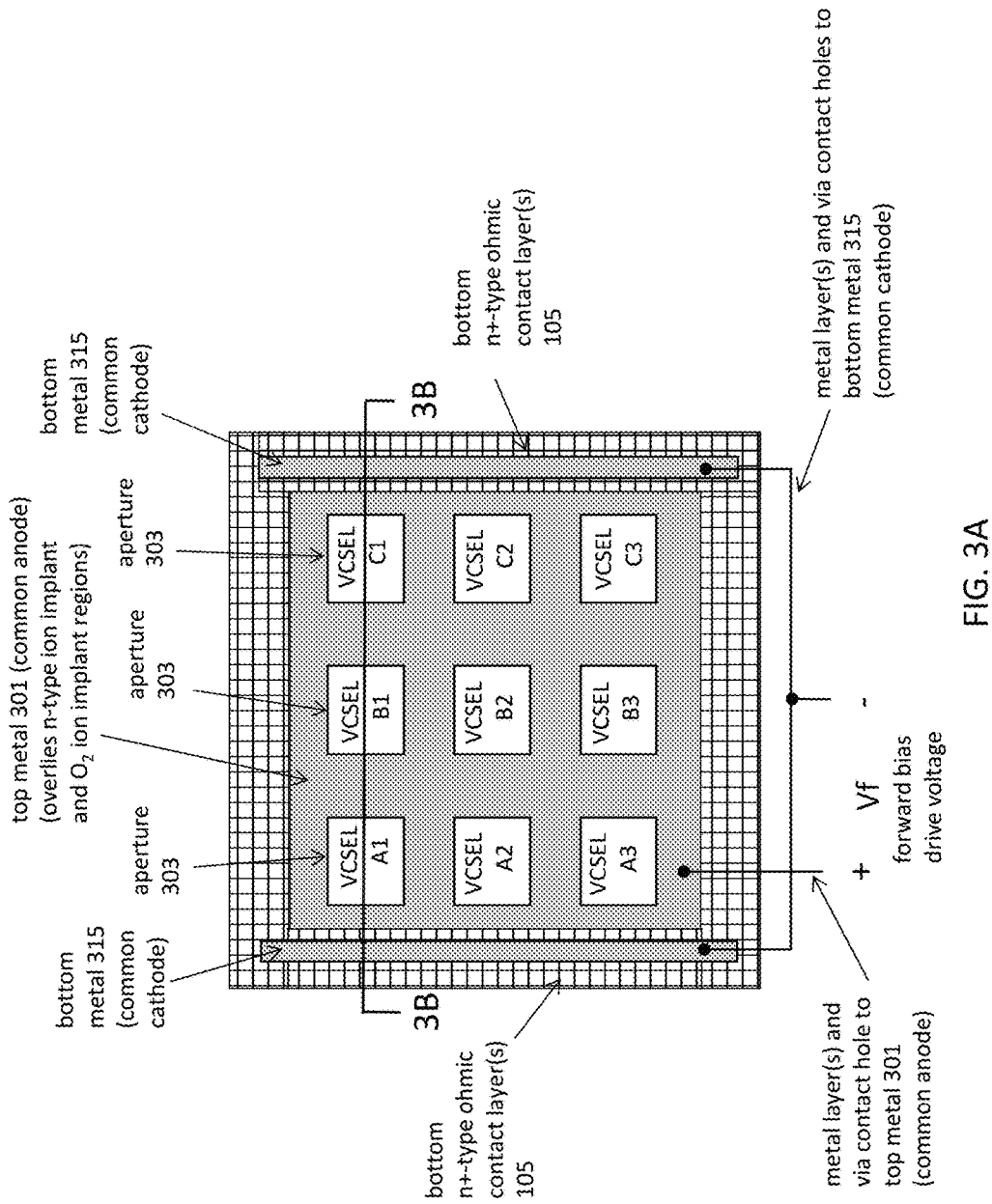
FIG. 3A is a top schematic view of an integrated circuit that includes a two-dimensional array of VCSEL devices realized from the layer structure of FIG. 1.
Figure 3B:
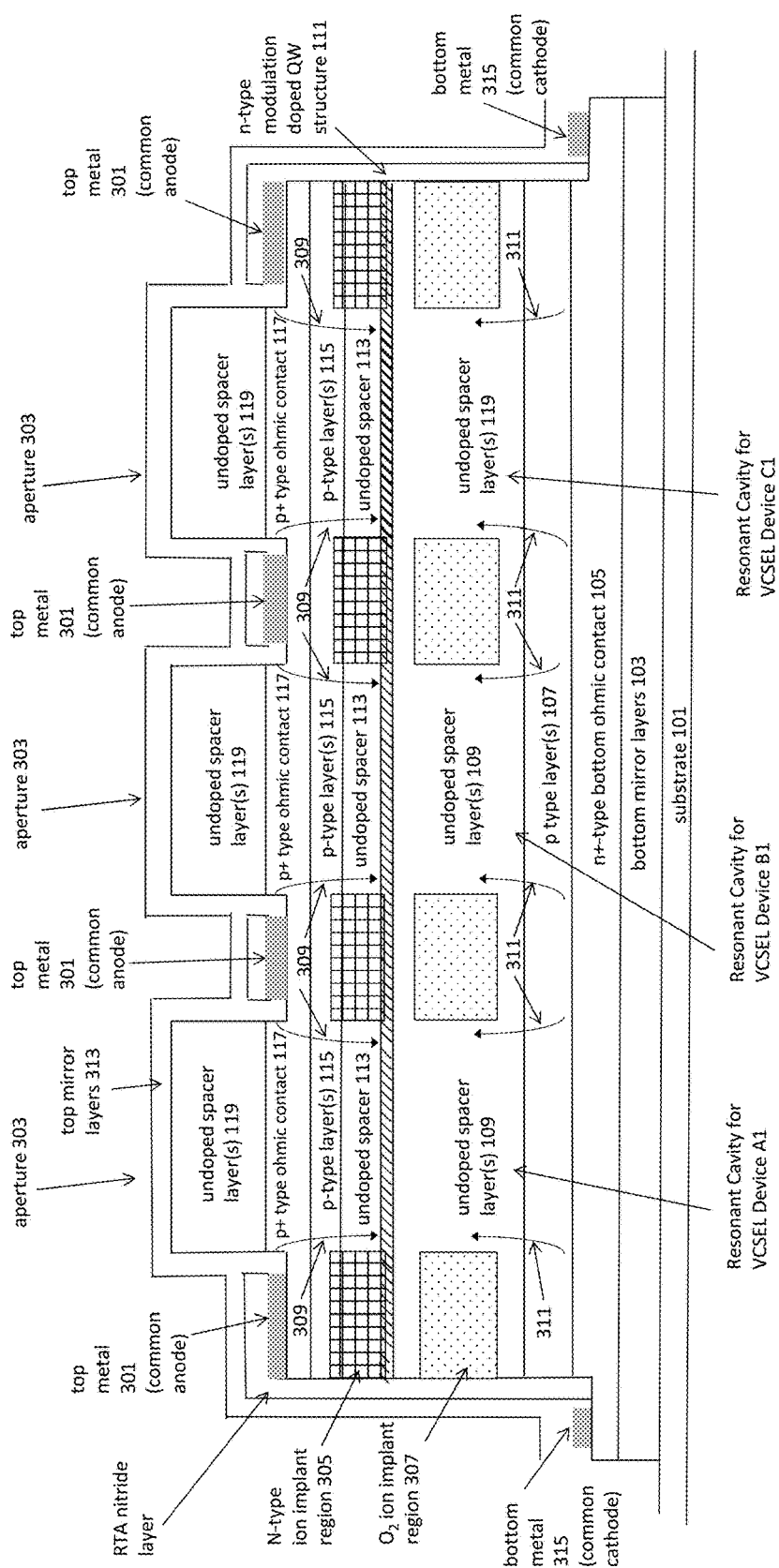
FIG. 3B is a schematic cross-sectional view of the integrated circuit of FIG. 3A, which includes an array of VCSEL devices realized from the layer structure of FIG. 1.

FIGS. 3A and 3B illustrate an integrated circuit that includes a two-dimensional array of VCSEL devices formed from the epitaxial layer structure of FIG. 1. As best shown in FIG. 3A, nine VCSEL devices are laid out in a 3×3 linear two-dimensional array (columns and rows). A patterned top metal layer 301 that realizes a common anode for the nine VCSEL devices surrounds an aperture 303 for each one of the nine VCSEL devices. The apertures 303 allow light that propagates in the resonant cavities of the VCSEL devices to exit therefrom for emission from the integrated circuit. The patterned top metal layer 301 is formed on the top p+-type ohmic contact layer(s) 117 as shown in FIG. 3B. The nine VCSEL devices have respective active optical regions formed by the n-type modulation doped QW structure 111 disposed below the apertures 303 for the nine VCSEL devices.

The patterned top metal layer 301 also overlies an N-type ion implant region 305 and an oxygen ($O_2$) ion implant region 307 that surround and extend laterally in a continuous manner (i.e., without interruption) between the nine VCSEL devices of the array as best shown in FIG. 3B. In one embodiment, the $O_2$ ion implant region 307 can be formed such that it extends vertically through at least part of the undoped spacer layer(s) 109 as shown. The N-type ion implant region 305 can be formed above the $O_2$ ion implant region 307 such that it extends vertically through at least part of the p-type layer(s) 115, completely through the undoped spacer layer(s) 113, and through at least part of the n-type modulation doped QW structure 111 as shown. In this manner, the N-type ion implant region 305 and the $O_2$ ion implant region 307 are formed above and below the respective active optical regions of the nine VCSEL devices. The N-type ion implant region 305 and the $O_2$ ion implant region 307 are subject to high temperature thermal anneal operations (for example, at temperatures at or above 850° C.), which activate and anneal these ion implant regions 305, 307. The N-type ion implant region 305 and the $O_2$ ion implant region 307 can be distributed in a Gaussian manner in the layer structure as is well known, which is not shown for the sake of simplicity. The activated and annealed N-type ion implant region 305 provides a P-N junction potential barrier that confines and funnels (concentrates) hole current that flows from the top metal anode 301 into the active optical regions of the nine VCSEL devices during forward biased operation, which is depicted graphically by arrows 309. The activated and annealed $O_2$ ion implant region 307 provides a high resistance current blocking barrier that confines and funnels (concentrates) electron current that flows from the J2 junction of the intermediate p-type layer(s) 107 and bottom n+-type ohmic contact layer(s) 105 into the active optical regions of the nine VCSEL devices during forward biased operation, which is depicted graphically by arrows 311. Electron current can also flow backward from the active optical regions to the J2 junction of the intermediate p-type layer(s) 107 and bottom n+-type ohmic contact layer(s) 105 of the nine VCSEL devices during forward biased operation. Hole current can also flow backward from the active optical regions to the J1 junction of the thin n+ type charge sheet of the n-type modulation doped structure and the top p+-type region of the nine VCSEL devices during forward biased operation. The activated and annealed implant regions 305, 307 also provide refractive index changes that aid in lateral confinement of light within the vertical resonant cavities of the nine VCSEL devices defined between the bottom mirror layers 103 and top mirror layers 313 as best shown in FIG. 3B.

A patterned bottom metal layer 315 that realizes a two-part common cathode for the nine VCSEL devices is formed on the bottom n+-type ohmic contact layer(s) 105 on opposite sides of the nine VCSEL devices as shown. A forward bias drive voltage $V_f$ is applied across the common anode 310 and the two-part common cathode 315, for example by metal layers and corresponding via contact holes, as shown in FIG. 3A. The forward bias drive voltage $V_f$ is configured such that it turns ON the nine diode-like VCSEL devices of the array (for example, with a forward bias of greater than 1.5 volts). In this ON state, each VCSEL device of the array conducts current from the common anode to the common cathode, which injects current into the active optical regions of the respective VCSEL devices. The electron and hole current injected into the active optical regions of the respective VCSEL devices produces stimulated emission of light (photons) that resonates within the vertical resonant cavities of the nine VCSEL devices and that is emitted from the apertures 303 of the nine VCSEL devices. In some embodiments, the optical power of the light emitted from the apertures 303 of the nine VCSEL devices can be controlled by controlling the magnitude of the forward bias drive voltage $V_f$.

In other configurations, the drive voltage $V_f$ can be configured such that it turns OFF all of the diode-like VCSEL devices of the array (for example, with a bias of zero volts or other voltage less than 1.5 volts). In this OFF state, each VCSEL device of the array does not conduct current from the common anode to the common cathode, and the nine VCSEL devices do not produce stimulated emission of light (photons) within the vertical resonant cavities of the nine VCSEL devices nor emission of light from the apertures 303 of the nine VCSEL devices.

Figure 3C:
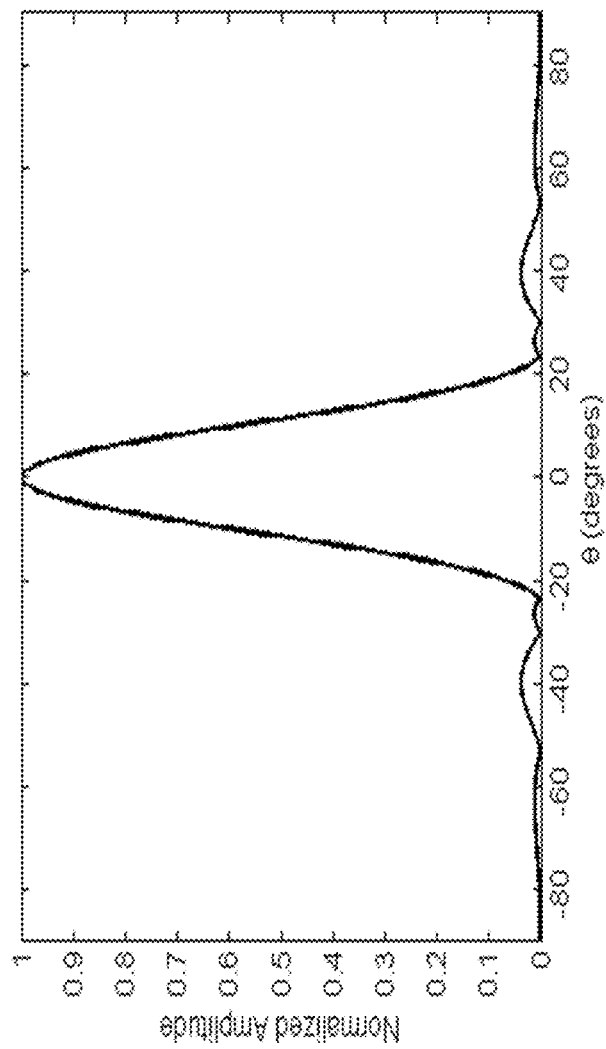
FIG. 3C is a graph showing an exemplary far-field pattern for the light emitted from the array of VCSEL devices of the integrated circuit of FIGS. 3A and 3B.

The diode-like VCSEL devices of the array can be laid out in a closely-spaced arrangement such that, under application of the forward bias drive voltage $V_f$, the VCSEL devices of the array experience mode-coupling that produces a coherent single mode output with continuous wave (CW) operation with a dominant single lobe far field pattern as illustrated in FIG. 3C. The dominant single lobe far field pattern can have a narrow divergence angle $\theta$ of less than 20° as illustrated in the exemplary far field pattern of FIG. 3C.

Figure 3D:
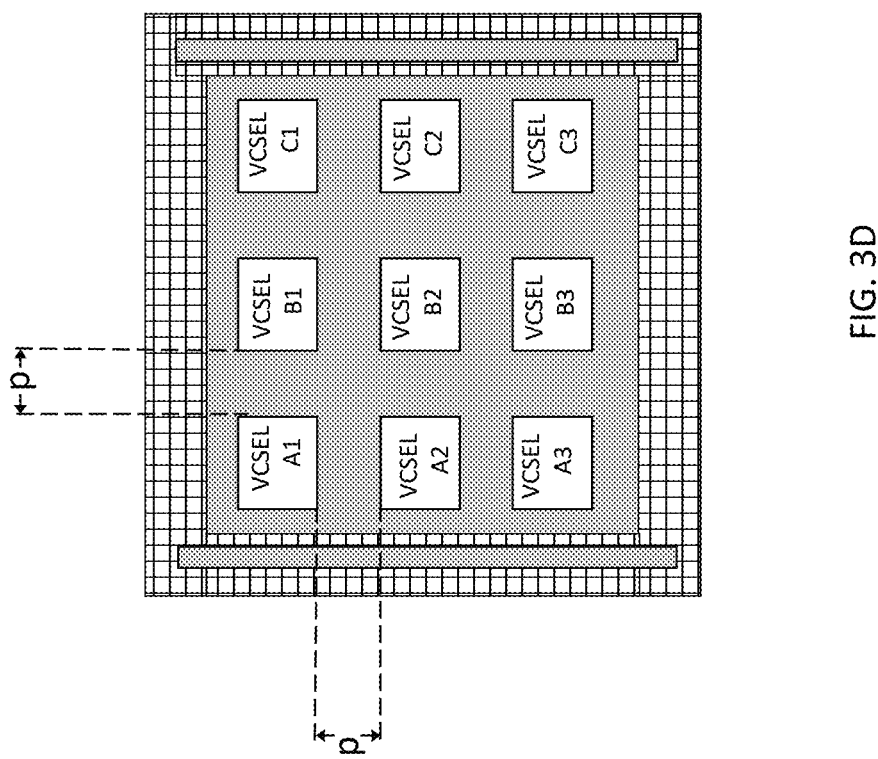
FIG. 3D is a top schematic view of the integrated circuit of FIGS. 3A and 3B, that shows the pitch parameter that describes the spacing between the VCSEL devices of the integrated circuit.

Note that the vertical structure of the VCSEL devices of the array are isolated by the n-type implant region 305 and the oxygen ion implant region 307 that surrounds and extends laterally in a continuous manner (i.e., without interruption) between the VCSEL devices of the array, and avoids an isolation etch between the VCSEL devices of the array. This feature allows the lateral spacing between the apertures of the VCSEL devices of the array, which is given by the parameter "p" as shown in FIG. 3D, to be reduced to values of 3 μm and possibly less. This feature improves the near-field mode coupling and the single lobe far field pattern as well as the optical power of the emitted light of the VCSEL array. It also allows for integration of a large number of VCSEL devices for a given chip area, which can be used to improve the optical power of the emitted light of the VCSEL array.

Furthermore, the activated and annealed oxygen ion implant region 307 can function to confine and funnel (concentrates) electron current from the J2 junction of the intermediate p-type region and the bottom n+-type region to the active optical region of the VCSEL devices, which aids in producing stimulated emission of light in the active region of the VCSEL devices. The activated and annealed oxygen ion implant region 307 can also provide a refractive index change that can aid in lateral confinement of light within the vertical resonant cavities of the VCSEL devices of the array defined between the bottom mirror layers and top mirror layers.

FIG. 4 illustrates an exemplary layer structure utilizing group III-V materials for realizing the active device structure of FIG. 1. The layer structure of FIG. 4 can be used to form an array of VCSEL devices that emit 850 nm light as part of an integrated circuit similar to the integrated circuit described above with respect to FIGS. 3A to 3D. The layer structure of FIG. 4 can be made, for example, using known molecular beam epitaxy (MBE) or Metal-Organic Chemical Vapor Deposition (MOCVD) techniques.

First, a semiconductor layer 403 of aluminum arsenide (AlAs) and a semiconductor layer 405 of an alloy of aluminum gallium arsenide ($Al_{x1}Ga_{(1-x1)}As$, where the parameter x1 is preferably 15%) are alternately deposited (with preferably at least five pairs) upon a semi-insulating gallium arsenide (GaAs) substrate 101 in sequence to form the bottom mirror layers. The number of AlAs layers 403 will preferably always be one greater than the number of AlGaAs layers 405 so that the last layer of the bottom mirror layers is shown as 407. In the preferred embodiment, the AlAs layers 403 are subjected to high temperature steam oxidation during fabrication to produce the compound $Al_xO_y$, so that a bottom DBR mirror will be formed at the designed center wavelength. This center wavelength is selected such that the desired resonant wavelength for the VCSEL devices will be subject to high reflectivity. In one embodiment, the thicknesses of layers 403 and 405 in the bottom mirror layers can be chosen so that the final optical thickness of GaAs and $Al_xO_y$ corresponds to one quarter wavelength of the center wavelength of 850 nm in this example. Alternatively, the bottom mirror can be formed by alternating layers of GaAs and AlAs with thicknesses corresponding to one-quarter of the designed wavelength (FIGS. 8, 9, 10). In this case, oxidation is not required. However, many more layer pairs (with typical numbers such as 27.5 pairs) are required to achieve the reflectivity needed for efficient optical lasing. The layers 403, 405 and 407 correspond to the bottom mirror layers 103 of FIG. 1 as described above. The GaAs substrate 401 corresponds to the substrate 101 of FIG. 1 as described above.

Deposited on the last AlAls layer 407 is the active device structure which begins with a buffer layer 409 of an undoped alloy of aluminum gallium arsenide ($Al_{x2}Ga_{(1-x2)}As$, where the parameter x2 is preferably 5%). Layer 409 has a thickness near 200 Å. Deposited on layer 409 are two n+ doped layers 411 and 413. Layer 411 is an n+ doped alloy of aluminum gallium arsenide ($Al_{x2}Ga_{(1-x2)}As$, where the parameter x2 is preferably 5%). Layer 411 has a thickness near 2446 Å and is doped n+ at the maximum bulk n type doping concentration, which is an n-type doping concentration of $3.5 \times 10^{18}$ cm$^{-3}$ in this example. Layer 413 is an n+ doped alloy of aluminum gallium arsenide ($Al_{x3}Ga_{(1-x3)}As$, where the parameter x3 is preferably 30%). Layer 413 has a thickness near 1000 Å and is doped n+ at the maximum bulk n type doping concentration, which is an n-type doping concentration of $3.5 \times 10^{18}$ cm$^{-3}$ in this example. The n+ doped AlGaAs layers 411 and 413 can function electrically as part of the gate region of the inverted p-type FET and the bottom n-type region of the layer structure of the VCSEL devices. The n+ doped AlGaAs layers 411 and 413 can provide a low resistance ohmic contact for device metallization, including metallization that defines the common cathode of the VCSEL devices as well as metallization that defines the bottom gate of the inverted p-type FET as described herein. The n+ doped AlGaAs layers 411 and 413 correspond to the bottom n+-type ohmic contact layer(s) 105 of FIG. 1 as described above.

Deposited on layer 413 is a layer 415 of a p-type doped alloy of aluminum gallium arsenide ($Al_{x4}Ga_{(1-x4)}As$, where the parameter x3 is preferably 20%). Layer 415 has a thickness near 500 Å and a typical p-type doping concentration of $1.0 \times 10^{18}$ cm$^{-3}$. The p-type layer 415 can function electrically as part of the channel region of the inverted p-type FET and the intermediate p-type region of the layer structure of the VCSEL devices. The p-type layer 415 can also provide a source of holes that flow to the QWs of the active optical region (n-type modulation doped QW structure 111) of the VCSEL devices during operation of the VCSEL devices. The p-type layer 415 corresponds to the intermediate p-type layer(s) 107 of FIG. 1 as described above.

Note that the intermediate p-type layer 415 of the J2 junction of the layer structure has a built-in hole charge $Q_p$, which is dictated by the p-type dopant concentration and/or thickness of the intermediate p-type layer 415, and the n+ doped AlGaAs layers 411 and 413 of the J2 junction of the layer structure has a built-in electron charge $Q_n$, which is dictated by the n-type dopant concentration and/or thickness of the n+ doped AlGaAs layers 411 and 413. The built-in hole charge $Q_p$ of the J2 junction relative to the built-in electron charge $Q_n$ of the J2 junction can be configured such that the switching voltage $V_s$ is equal to the holding voltage $V_h$ for diode-like current-voltage characteristics of the VCSEL devices of the array. The doping concentration or thickness of one or more these layers can possibly be tuned in order to satisfy this condition. Testing can be performed to verify that this condition is satisfied by the design of the layer structure.

Following layer 415 is an undoped spacer layer 417 formed from an alloy of aluminum gallium arsenide ($Al_{x4}Ga_{(1-x4)}As$, where the parameter x4 is preferably 20%). Spacer layer 417 has a typical thickness of 3841 Å. Spacer layer 417 can function electrically as part of the back-gate (collector) region of the inverted p-type FET as well as part of the back-gate (collector) region for the n-channel HFET. Spacer layer 417 corresponds to the undoped spacer layer(s) 109 of FIG. 1 as described above.

Following spacer layer 417 is an undoped AlGaAs barrier layer 419 followed by an undoped GaAs quantum well layer 421. The undoped AlGaAs barrier layer 419 is formed from an alloy of aluminum gallium arsenide ($Al_{x4}Ga_{(1-x4)}As$, where the parameter x4 is preferably 20%) and has a typical thickness of 100 Å. The GaAs quantum well layer 421 has a typical thickness of 90 Å. The undoped AlGaAs barrier layer 419 and the GaAs quantum well layer 421 can be repeated for a number of quantum wells (such as two or more quantum wells) for the n-type modulation doped quantum structure. Single quantum well structures may also be used. Next is an undoped spacer layer 423 formed from an alloy of aluminum gallium arsenide ($Al_{x5}Ga_{(1-x5)}As$, where the parameter x5 is preferably 30%) with a typical thickness of 30 Å. Next is a thin n+-type charge sheet 425 formed from an alloy of aluminum gallium arsenide ($Al_{x5}Ga_{(1-x5)}As$, where the parameters x5 is preferably 30%). The charge sheet 425 is doped n+ at the maximum bulk n type doping concentration, which is an n-type doping concentration of $3.5 \times 10^{18}$ cm$^{-3}$ in this example. The charge sheet 425 has a typical thickness of 80 Å. The charge sheet 425 functions as a thin layer of n-type modulation doping for the n-type modulation doped quantum structure 111. The charge sheet 425 also forms the bottom plate of the capacitor (layers 441, 439, 437, 435, 433, 431, 429, 427, 425) that defines the input capacitance of the gate region of the n-channel HFET. The layers 425 to 419 corresponds to the n-type modulation doped QW structure 111 of FIG. 1 as described above. The n-type modulation doped QW structure 111 can serve as the active optical regions of the respective VCSEL devices. The charge sheet 425 can provide a source of electrons that flow to the one or more quantum wells (QWs) of the n-type modulation doped QW structure 111 of the VCSEL devices during operation of the VCSEL devices. The n-type modulation doped QW structure 111 can also serve electrically as part of the channel of the n-channel HFET device.

Next is an undoped spacer layer 427 formed from an alloy of aluminum gallium arsenide ($Al_{x5}Ga_{(1-x5)}As$, where the parameter x5 is preferably 30%). Layer 427 has a typical thickness of 300 Å. Spacer layer 427 forms the spacer layer between the bottom plate (charge sheet 425) and top plate (layer 429) of the capacitor that defines the input capacitance of the gate region of the n-channel HFET. The undoped AlGaAs layer 427 corresponds to the undoped spacer layer(s) 113 of FIG. 1 as described above.

Next are two layers (429, 431) that have a total thickness of about 92 Å and are doped with p+-type doping. The first layer 429 is an alloy of aluminum gallium arsenide ($Al_{x5}Ga_{(1-x5)}As$, where the parameter x5 is preferably 30%). The first layer 429 is p+ doped with a typical p-type doping concentration of $7 \times 10^{18}$ cm$^{-3}$ and has a typical thickness of 80 Å. Layer 429 forms the top plate of the capacitor that defines the input capacitance of the gate region of the n-channel HFET. The second layer 431 is GaAs that is p+ doped with a typical p-type doping concentration of $7 \times 10^{18}$ cm$^{-3}$ and has a typical thickness of 12 Å. Layer 431 provides a transition from layer 429 to the AlAs layer 433. Layer 431 can allow a temperature change between the growth of the AlGaAs of layer 429 and the AlAs layer 433. Next is a layer 433 of aluminum arsenide (AlAs) that has a total thickness of about 600 Å and that is doped with p-type doping concentration of $7 \times 10^{18}$ cm$^{-3}$. Next are two layers (435, 437) that have a total thickness of about 545 Å and are doped with p+-type doping. The first layer 435 is GaAs that is p+ doped with a typical p-type doping concentration of $7 \times 10^{18}$ cm$^{-3}$ and has a typical thickness of 12 Å. Layer 435 provides a transition from layer 433 to layer 437. Layer 435 can allow a temperature change between the growth of the AlAs layer 433 and the AlGaAs of layer 437. Layer 437 is an alloy of aluminum gallium arsenide ($Al_{x6}Ga_{(1-x6)}As$, where the parameters x6 is preferably 5%). Layer 437 is p+ doped with a typical p-type doping concentration of $7 \times 10^{18}$ cm$^{-3}$ and has a typical thickness of 533 Å. Layers 429, 431, 433, 435, 437 corresponds to p-type layer(s) 115 of FIG. 1 as described above.

Next are two layers (439, 441) that have a total thickness of about 600 Å and are doped with p+-type doping of $1 \times 10^{20}$ cm$^{-3}$. Layer 439 is an alloy of aluminum gallium arsenide ($Al_{x6}Ga_{(1-x6)}As$, where the parameters x6 is preferably 5%). Layer 439 is p+ doped with a typical p-type doping concentration of $1 \times 10^{20}$ cm$^{-3}$ and has a typical thickness of 400 Å. Layer 441 is GaAs that is p+ doped with a typical p-type doping concentration of $1 \times 10^{20}$ cm$^{-3}$ and has a typical thickness of 200 Å. The p+ doped layers 439, 441 correspond to the top p+-type ohmic contact layer(s) 117 of FIG. 1 as described above.

Next are two undoped layers (443, 445) that have a total thickness of about 400 Å. Layer 443 is an alloy of aluminum gallium arsenide ($Al_{x6}Ga_{(1-x6)}As$, where the parameters x6 is preferably 5%) and has a typical thickness of 300 Å. Layer 445 is GaAs and has a typical thickness of 100 Å. The undoped layers 443, 445 can be used to form the apertures 303 of the VCSEL devices as described herein. Layers 443, 445 correspond to the undoped spacer layer(s) 119 of FIG. 1 as described above.

Semiconductor mirror layers can be deposited on the undoped spacer layer 445 to define a resonant cavity bounded on the top by the interface between the top semiconductor mirror layers and the undoped spacer layer 445 and bounded on the bottom by the interface between the undoped buffer layer 409 and the bottom mirror layer 407.

Note that in the embodiment of FIG. 4, the thicknesses and refractive indices of layers 445 to 423 provide an effective optical path length for the upper part of this resonant cavity that matches or corresponds to the desired center wavelength $\lambda_c$ of emission at 850 nm. In other words, the thicknesses and refractive indices of layers 445 to 423 provide an effective optical path length for the upper part of this resonant cavity equal to the desired center wavelength $\lambda_c$ of emission at 850 nm. Furthermore, the thicknesses and refractive indices of layers 421 to 409 provide an effective optical path length for the lower part of this resonant cavity that corresponds to the ratio of (integer N*the desired center wavelength of emission at 850 nm) over 2. In other words, the thicknesses and refractive indices of layers 421 to 409 provide an effective optical path length for the lower part of this resonant cavity equal to $(N*\lambda c)/2$.

FIGS. 5A to 5G are schematic partial cross-sectional views that illustrate exemplary fabrication operations in conjunction with the epitaxial layer structure of FIG. 4 to form a two-dimensional array of VCSEL devices realized in an integrated circuit (IC) similar to the integrated circuit described above with respect to FIGS. 3A to 3D.

Figure 5A:
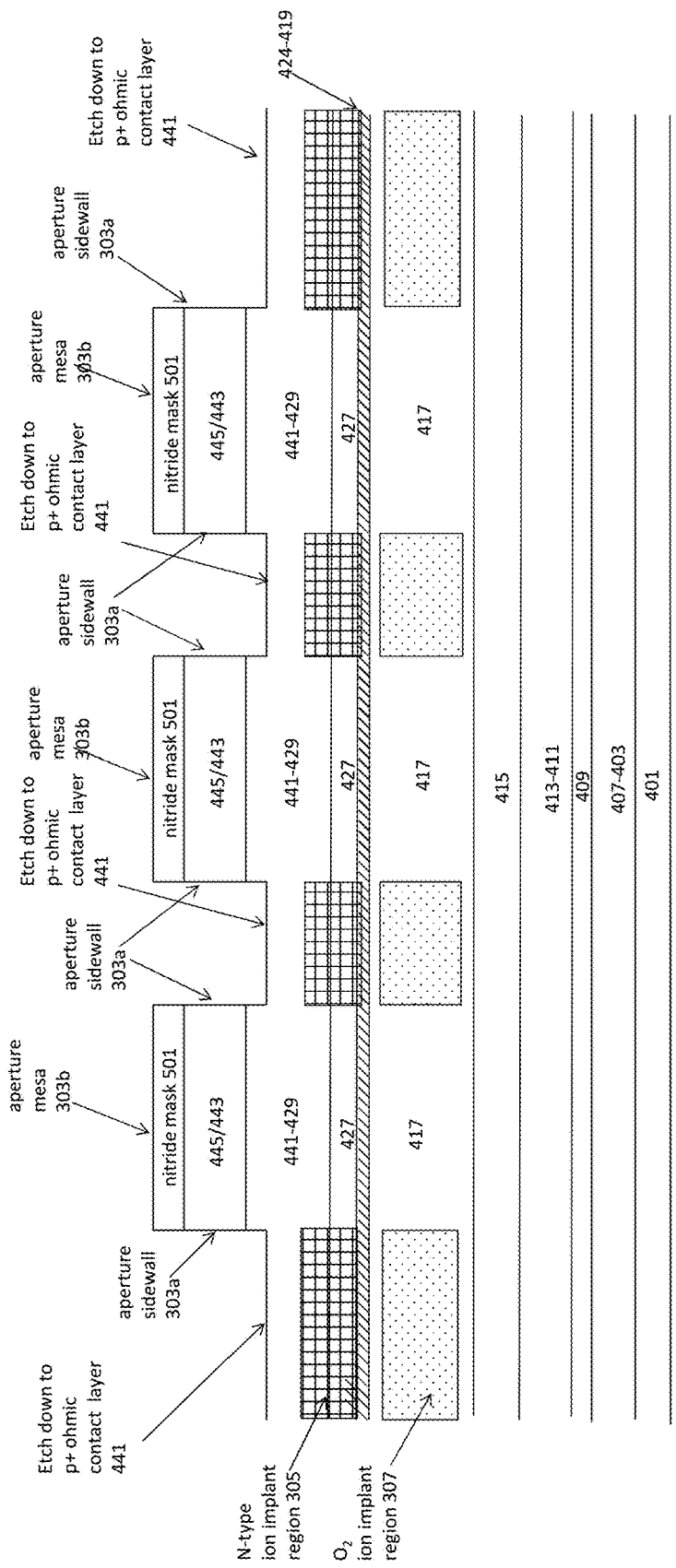
FIGS. 5A to 5G are schematic partial cross-sectional views that illustrate exemplary fabrication operations in conjunction with the layer structure of FIG. 4 to form a two-dimensional array of VCSEL devices realized in an integrated circuit similar to the integrated circuit of FIGS. 3A to 3D.

The fabrication operations begin by forming aperture mesas 303b in the top undoped spacer layers 445, 443 for the apertures of the VCSEL devices as shown in FIG. 5A. Such aperture mesas 303b are formed by depositing a nitride mask layer 501 on the semiconductor layer structure. Photoresist (not shown) is deposited and patterned. The patterned photoresist functions as an etch mask that defines the aperture mesas 303b. An etch operation is performed using the photoresist etch mask through the nitride mask layer 501 and into the semiconductor layer structure down through the top undoped spacer layers 445, 443 to expose a planar surface at the top p+-type ohmic contact layer (p+ ohmic contact layer 441). The aperture mesas 303b have sidewalls 303a that extend from a top surface formed in the semiconductor layer structure to the planar surface at the top p+-type ohmic contact layer (p+ ohmic contact layer 441) as shown.

The patterned photoresist can also function as an implant mask. Using the photoresist implant mask, oxygen ions and then n-type dopant ions (e.g., SiF ions) are implanted into the semiconductor layer structure such that the resulting N-type ion implant region 305 and O₂ ion implant region 307 will surround and extend laterally in a continuous manner (i.e., without interruption) between the VCSEL devices of the array as best shown in FIG. 5A. The oxygen ions of the O₂ ion implant region 307 are implanted to a depth centered at or near the intermediate undoped AlGaAs spacer layer 417. The n-type dopant ions (e.g., SiF ions) of the N-type ion implant region 305 are implanted to a depth centered at or near the p+-type AlAs layer 433. The N-type ion implant region 305 is formed above the O₂ ion implant region 307 such that it extends vertically completely through the undoped AlGaAs spacer layer 427 and through at least part of the n-type modulation doped QW structure of layers 424 to 419 as shown. The n-type ion implant region 305 and the O₂ ion implant region 307 can be distributed in a Gaussian manner in the layer structure as is well known, which is not shown for the sake of simplicity. The photoresist mask can then be removed leaving behind the patterned nitride mask layer 501 that covers the aperture mesas 303b as shown in FIG. 5A.

Figure 5B:
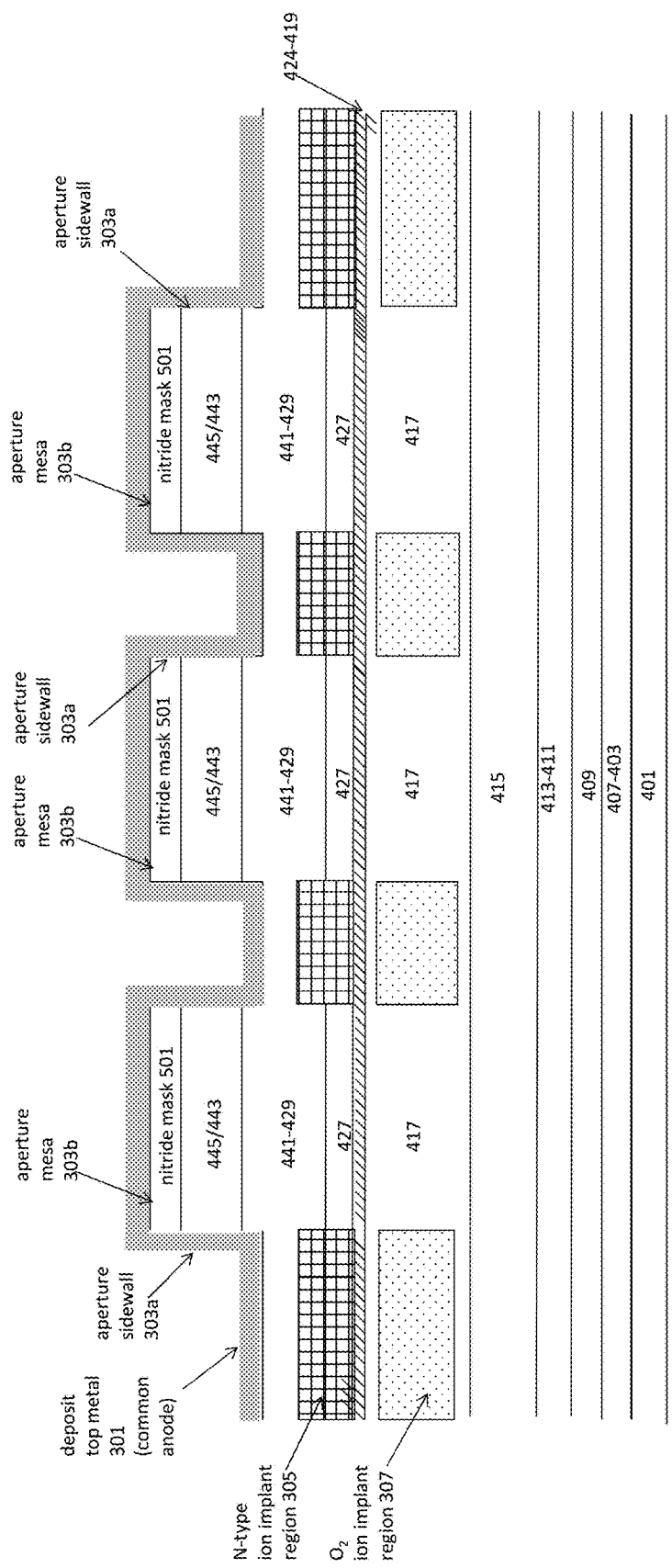

Next, with the nitride mask layer 510 covering the aperture mesas 303b, a layer of metal 301 is deposited on the resultant structure such that it is formed on the planar surface at the top p+ ohmic contact layer (p+ ohmic contact layer 441), the aperture sidewalls 303a and the nitride mask layer 510 covering the aperture mesas 303b as shown in FIG. 5B. In one embodiment, the metal layer 301 can be formed from tungsten (W) or from a combination of tungsten (95%) and indium (5%). The metal layer 301 of tungsten (W) and indium (In) can be formed by co-sputtering of tungsten and indium or other suitable means.

Figure 5C:
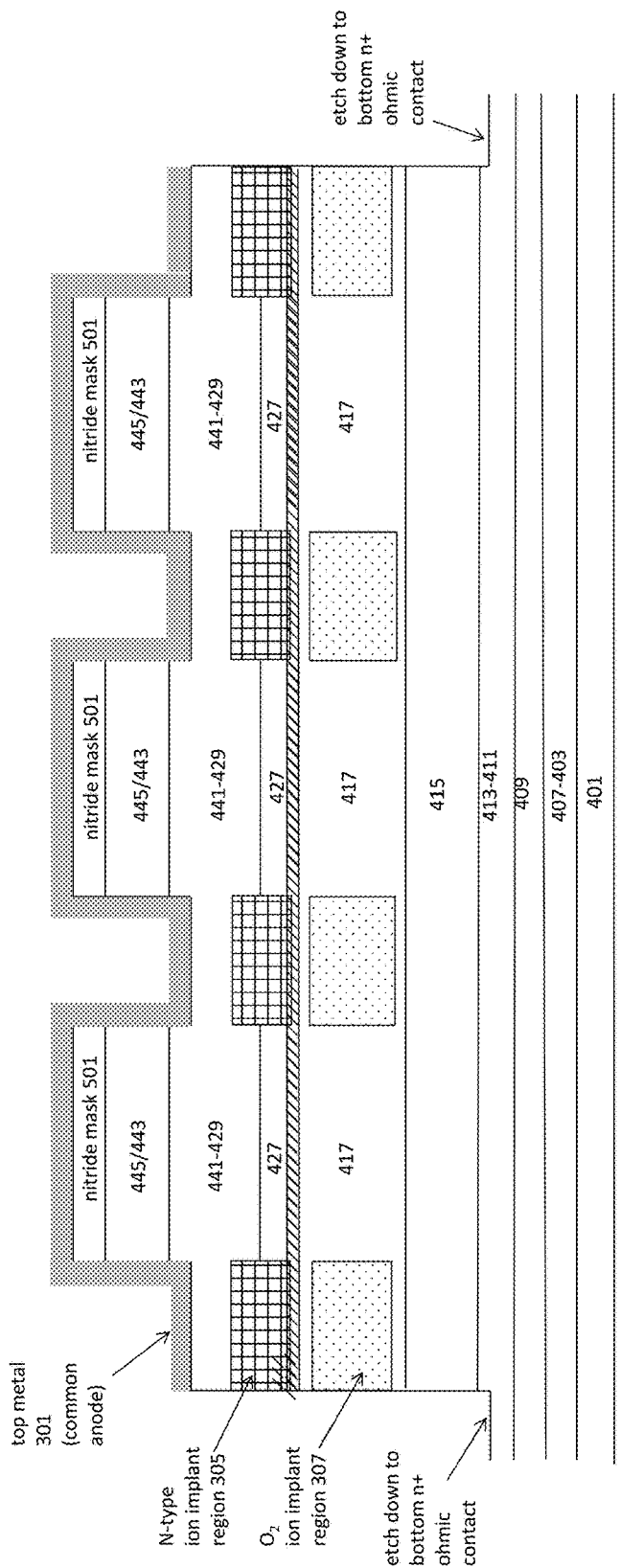

Next, a planar surface at the bottom n+-type ohmic contact layer (n+ doped AlGaAs layer 413) is formed as shown in FIG. 5C. In this step, photoresist is deposited and patterned. The patterned photoresist (not shown) functions as an etch mask for etching away the top anode metal layer 301 and semiconductor layer structure to define a planar surface at the bottom n+-type ohmic contact layer (n+ doped AlGaAs layer 413) as well as a sidewall leading to such planar surface. The patterned photoresist etch mask can then be removed.

Figure 5D:
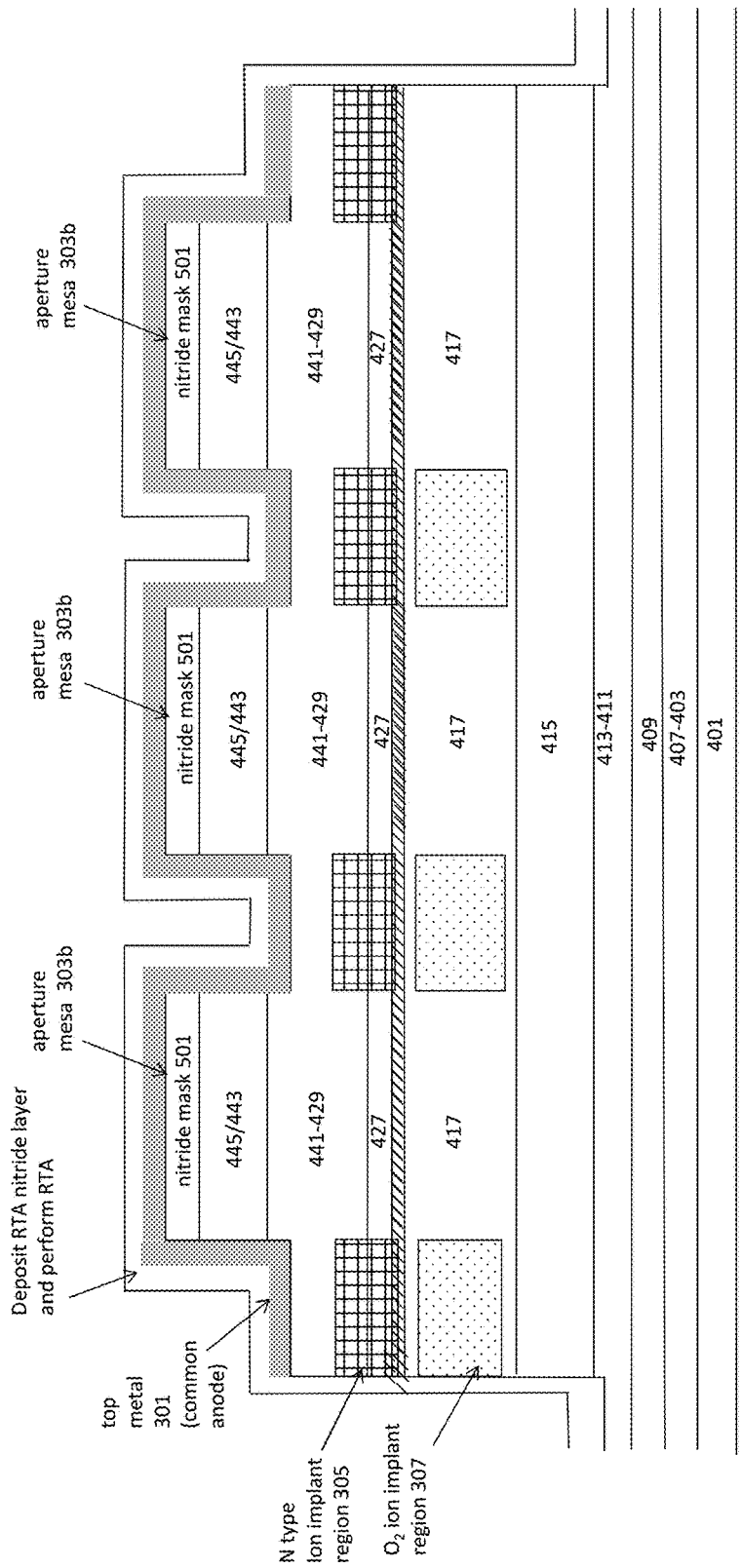

Next, a thermal anneal process is performed to activate the earlier-implanted ion-implant regions. In this operation, a capping layer of nitride (referred to as an RTA nitride layer) is deposited that covers the structure as shown in FIG. 5D. A rapid thermal anneal (RTA) process is performed on the structure in order to activate and anneal the earlier-implanted ion-implant regions (e.g., the ion-implanted regions 305, 307 as described herein). In one embodiment, the RTA process is carried out at 850° C. for 15 seconds. The activated and annealed N-type ion implant region 305 provides a P-N junction potential barrier that confines and funnels (concentrates) hole current that flows from the top metal anode 301 into the active optical regions of the VCSEL devices during forward biased operation as described herein.

The activated and annealed O₂ ion implant region 307 provides a high resistance current blocking barrier that confines and funnels (concentrates) electron current that flows from the J2 junction of the intermediate p-type layer(s) (p-type layer 415) and the bottom n+-type ohmic contact layer (n+ doped AlGaAs layer 413) into the active optical regions of the VCSEL devices during forward biased operation as described herein. Electron current can also flow backward from the active optical regions to the J2 junction of the intermediate p-type layer(s) and bottom n+-type ohmic contact layer(s) of the VCSEL devices during forward biased operation. Hole current can also flow backward from the active optical regions to the J1 junction of the thin n+ type charge sheet of the n-type modulation doped structure and the top p+-type region of the VCSEL devices during forward biased operation. The activated and annealed implant regions 305, 307 also provide refractive index changes that aid in lateral confinement of light within the vertical resonant cavities of the VCSEL devices defined between the bottom mirror layers and top mirror layers as described herein.

Note that the O₂ ion implant region 307 is annealed at temperature greater than 800° C., which functions to remove all damage. This eliminates surface states and trapping centers along the periphery of the O₂ ion implant region 307 and provides a mechanism for high resistance. It is distinctly different from a damage type implant of Oxygen with lower anneal temperatures less than 800° C. The higher anneal temperatures above 800° C. convert the material to a semi-insulating state just as the Cr+ atom does in the creation of semi-insulating GaAs substrates. Thus, at the implant boundary after the high temperature anneal, surface states as well as all recombination sites due to damage are eliminated for high resistance.

Figure 5E:
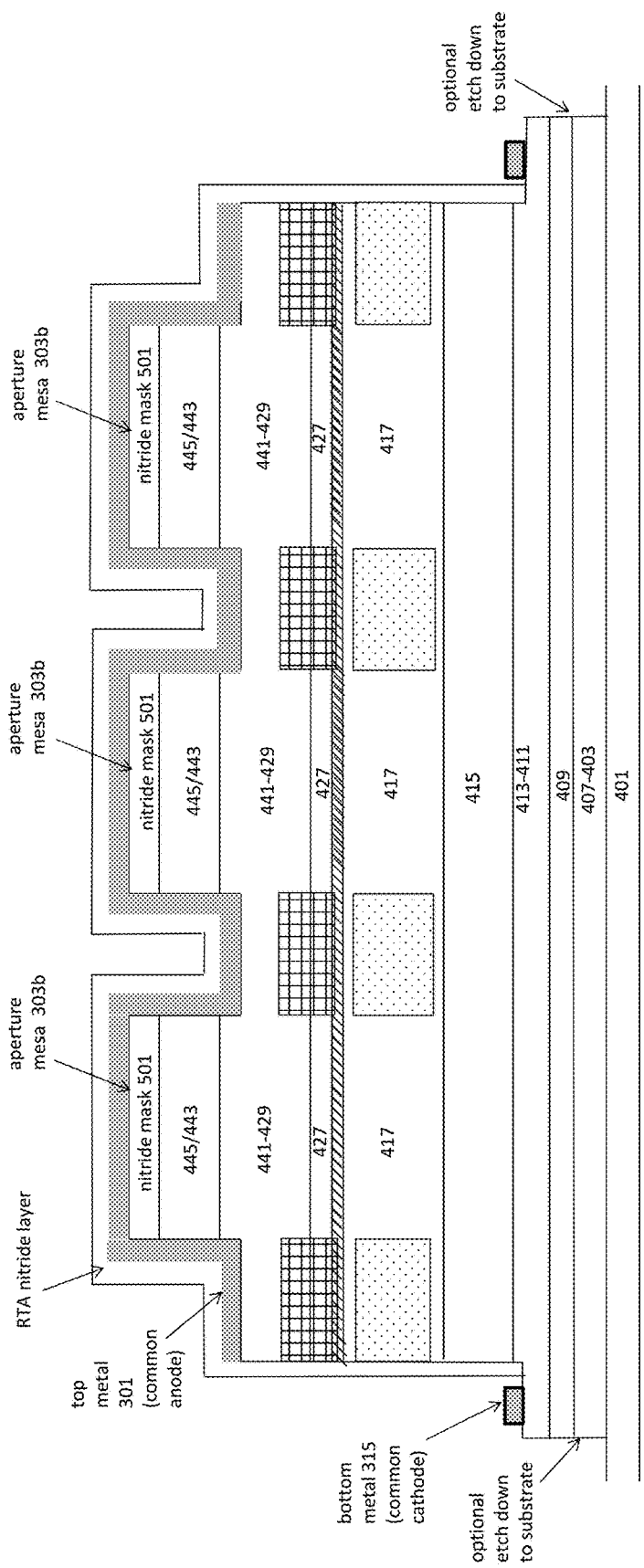

Next, a layer of metal 513 (such as gold) for the common two-part bottom cathode is deposited and patterned on the planar surface at the bottom n+-type ohmic contact layer (n+ doped AlGaAs layer 413) as shown in FIG. 5E. The patterning of the metal 513 can use lift-off or other suitable metallization technique.

Next, an optional isolation etching operation is performed that etches down to near the substrate as shown in FIG. 5E. This can be used for all devices of the IC. This operation is useful for the case where the bottom mirror layers as formed as part of the layer structure function as a suitable DBR mirror without oxidation.

Figure 5F:
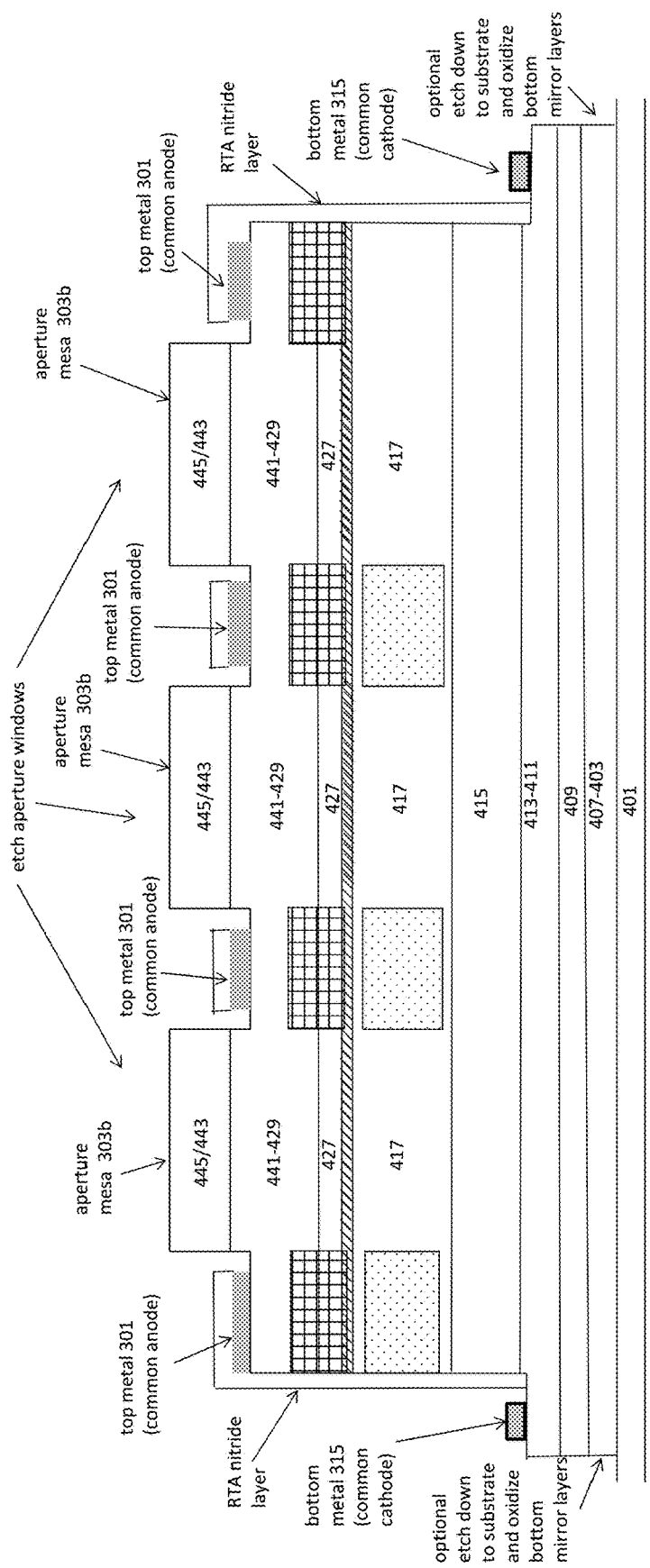

Next, the RTA nitride layer, the top metal layer 301, and the nitride mask 501 that covers the aperture mesas 303b are etched to form aperture windows that expose the aperture mesas 303b as shown in FIG. 5F. In this step, photoresist is deposited and patterned. The patterned photoresist functions as an etch mask to pattern the cumulative layers (the RTA nitride layer, the top metal layer 301, and the nitride mask 501) that covers the aperture mesas 303b to form aperture windows that expose the aperture mesas 303b. The patterned photoresist etch mask can then be removed.

The aperture window etch operation can optionally perform an isolation etch that etches down to near the substrate as shown in FIG. 5F. This can be used for all devices of the IC. The bottom mirror layers (layers 403, 405, 407) that are exposed by the isolation etch can be subject to oxidation. This operation is useful for the case where the bottom mirror layers as formed as part of the layer structure do not function as a suitable DBR mirror. In one embodiment, the bottom mirror layers 403 and 407 of AlAs that are exposed by the isolation etch are subject to a steam ambient that converts the aluminum arsenide (AlAs) to aluminum oxide ($Al_xO_y$), which form the bottom DBR mirror. Note that any AlAs layer above the AlAs bottom mirror layers that have been exposed during early processing can be protected by nitride layer(s) such that oxygen from the steam ambient does not reach and react with such AlAs layer.

Figure 5G:
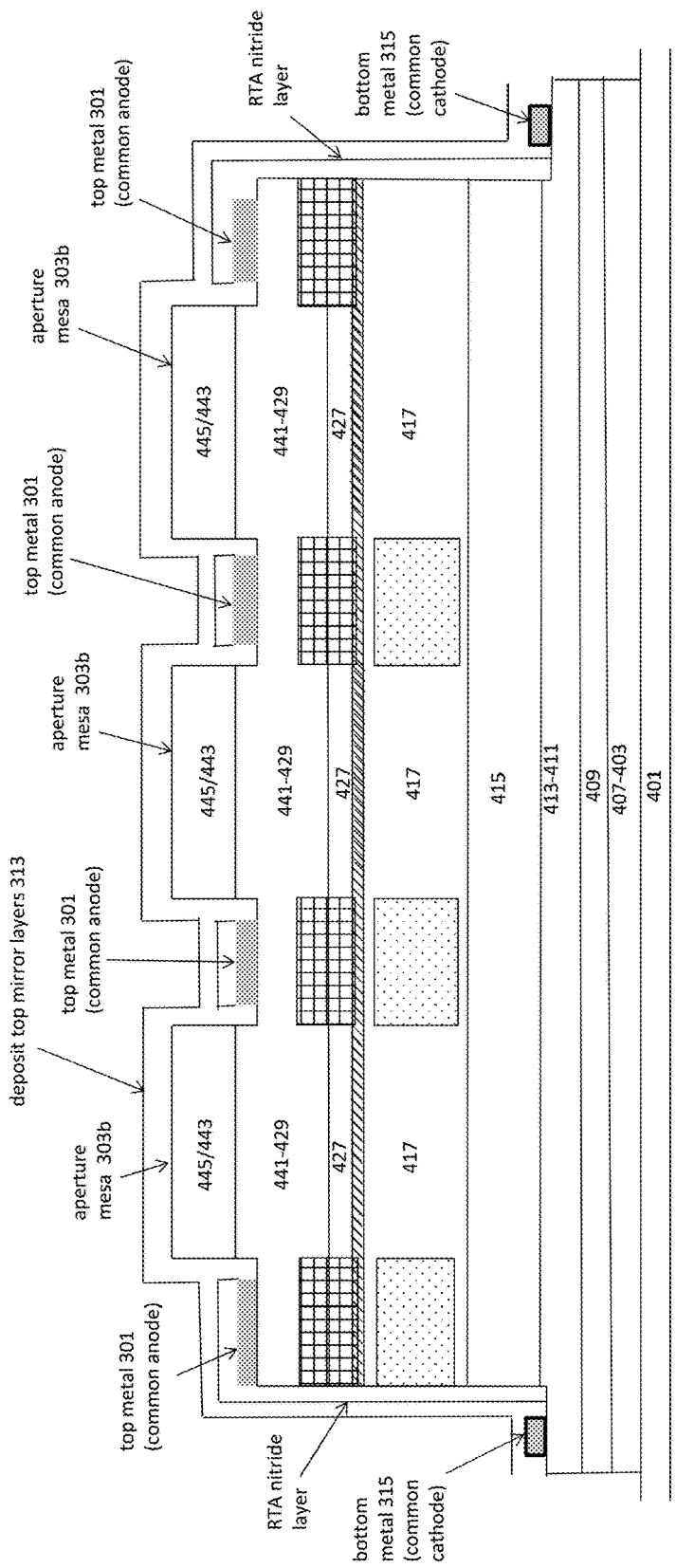

Next, top mirror layers 313 can be deposited as shown in FIG. 5G. In one example, the top mirror layers 313 comprise alternating layers of $SiO_2$ and a high refractive index material such as Si, $TiO_2$, GaAs, or GaN. The top mirror layers 313 can be formed in the opened aperture windows such that top mirror layers 313 cover the exposed apertures mesas 303b as shown. Note that the aperture mesas 303b and top mirror layers 313 deposited thereon can be configured to form the apertures 303 that allow light that propagates in the resonant cavity of the VCSEL devices to exit therefrom for emission from the integrated circuit.

Additional operations can be performed as desired. Such additional operations can involve formation of insulating layers (dielectrics), metal levels and vias, and bonding sites for chip-to-package connections as is well known in the semiconductor arts.

FIG. 6 illustrates another exemplary layer structure utilizing group III-V materials for realizing the active device structure of FIG. 1. The layer structure of FIG. 6 can be used to define an array of VCSEL devices that emit 850 nm light as part of an integrated circuit similar to the integrated circuit described above with respect to FIGS. 3A to 3D. The layer structure of FIG. 6 can be made, for example, using known molecular beam epitaxy (MBE) or Metal-Organic Chemical Vapor Deposition (MOCVD) techniques.

Note that the layer structure of FIG. 6 is similar to the layer structure of FIG. 4 but uses an alloy of indium gallium arsenide ($In_{x1}Ga_{(1-x1)}As$, where the parameters x1 is preferably 5%) for the quantum wells of the n-type modulation doped QW structure as a substitute for the GaAs quantum wells of the layer structure of FIG. 4.

Also note that, in the embodiment of FIG. 6, the thicknesses and refractive indices of layers 645 to 623 provide an effective optical path length for the upper part of the resonant cavities of the VCSEL devices that matches or corresponds to the desired center wavelength $\lambda_c$ of emission at 850 nm. In other words, the thicknesses and refractive indices of layers 645 to 623 provide an effective optical path length for the upper part of the resonant cavities equal to the desired center wavelength $\lambda_c$ of emission at 850 nm. Furthermore, the thicknesses and refractive indices of layers 621 to 609 provide an effective optical path length for the lower part of the resonant cavities of the VCSEL devices that corresponds to the ratio of (integer N*the desired center wavelength of emission at 850 nm) over 2. In other words, the thicknesses and refractive indices of layers 621 to 609 provide an effective optical path length for the lower part of the resonant cavities equal to $(N*\lambda_c)/2$.

Also note that the exemplary fabrication operations of FIGS. 5A to 5G as described above can be used to form a two-dimensional array of VCSEL devices realized in an integrated circuit (IC) that employs the epitaxial layer structure of FIG. 6.

FIG. 7 illustrates yet another exemplary layer structure utilizing group III-V materials for realizing the active device structure of FIG. 1. The layer structure of FIG. 7 can be used to define an array of VCSEL devices that emit 850 nm light as part of an integrated circuit similar to the integrated circuit described above with respect to FIGS. 3A to 3D. The layer structure of FIG. 7 can be made, for example, using known molecular beam epitaxy (MBE) or Metal-Organic Chemical Vapor Deposition (MOCVD) techniques.

Note that, in the embodiment of FIG. 7, the layers for the lower part of the resonant cavities of the VCSEL devices is similar to the layer structure of FIG. 4, but the layers for the upper part of the resonant cavities of the VCSEL devices is modified such that the thicknesses and refractive indices of these layers provide an effective optical path length for the upper part of the resonant cavities of the VCSEL devices that matches or corresponds to one-half of the desired center wavelength $\lambda_c$ of emission at 850 nm. In other words, the thicknesses and refractive indices of layers 745 to 223 provide an effective optical path length for the upper part of the resonant cavities equal to one half of the desired center wavelength $\lambda_c$ of emission at 850 nm. Similar to the embodiment of FIG. 4, the thicknesses and refractive indices of layers 721 to 709 provide an effective optical path length for the lower part of the resonant cavities of the VCSEL devices that corresponds to the ratio of (integer N*the desired center wavelength of emission at 850 nm) over 2. In other words, the thicknesses and refractive indices of layers 721 to 709 provide an effective optical path length for the lower part of the resonant cavities equal to $(N*\lambda_c)/2$.

Also note that the exemplary fabrication operations of FIGS. 5A to 5G as described above can be used to form a two-dimensional array of VCSEL devices realized in an integrated circuit (IC) that employs the epitaxial layer structure of FIG. 7.

FIG. 8 illustrates another exemplary layer structure utilizing group III-V materials for realizing the active device structure of FIG. 1. The layer structure of FIG. 8 can be used to define an array of VCSEL devices that emit 980 nm light as part of an integrated circuit similar to the integrated circuit described above with respect to FIGS. 3A to 3D. The layer structure of FIG. 8 can be made, for example, using known molecular beam epitaxy (MBE) or Metal-Organic Chemical Vapor Deposition (MOCVD) techniques.

Note that the layer structure of FIG. 8 is similar to the layer structures of FIG. 6, but uses an alloy of indium gallium arsenide ($In_{x1}Ga_{(1-x1)}As$, where the parameters x1 is preferably 20%) as the quantum wells along with GaAs barrier layers as part of the n-type modulation doped QW structure.

Also note that, in the embodiment of FIG. 8, the bottom mirror is formed by alternating layers of GaAs and AlAs (specifically 27.5 layer pairs) with thicknesses and refractive indices that provide an effective optical path length corresponding to one-quarter of the designed wavelength of 980 nm. In this case, oxidation of the alternating layers of GaAs and AlAs is not required. In other embodiments, the bottom mirror can be formed by growing alternating layers of GaAs and AlAs (such as 5.5 layer pairs) and performing oxidation of such layers as described herein.

Also note that, in the embodiment of FIG. 8, the thicknesses and refractive indices of layers 945 to 923a provide an effective optical path length for the upper part of the resonant cavities of the VCSEL devices that matches or corresponds to the desired center wavelength $\lambda_c$ of emission at 980 nm. In other words, the thicknesses and refractive indices of layers 945 to 923a provide an effective optical path length for the upper part of the resonant cavities equal to the desired center wavelength $\lambda_c$ of emission at 980 nm. Furthermore, the thicknesses and refractive indices of layers 921 to 911 provide an effective optical path length for the lower part of the resonant cavities of the VCSEL devices that corresponds to the ratio of (integer N*the desired center wavelength of emission at 980 nm) over 2. In other words, the thicknesses and refractive indices of layers 921 to 911 provide an effective optical path length for the lower part of the resonant cavities equal to $(N^*\lambda_c)/2$.

Also note that the exemplary fabrication operations of FIGS. 5A to 5G as described above can be used to form a two-dimensional array of VCSEL devices realized in an integrated circuit (IC) that employs the epitaxial layer structure of FIG. 8.

FIG. 9 illustrates still another exemplary layer structure utilizing group III-V materials for realizing the active device structure of FIG. 1. The layer structure of FIG. 9 can be used to define an array of VCSEL devices that emit 980 nm light as part of an integrated circuit similar to the integrated circuit described above with respect to FIGS. 3A to 3D. The layer structure of FIG. 9 can be made, for example, using known molecular beam epitaxy (MBE) or Metal-Organic Chemical Vapor Deposition (MOCVD) techniques.

Note that, in the embodiment of FIG. 9, the layers for the lower part of the resonant cavities of the VCSEL devices is similar to the layer structure of FIG. 8, but the layers for the upper part of the resonant cavities of the VCSEL devices is modified such that the thicknesses and refractive indices of these layers provide an effective optical path length for the upper part of the resonant cavities of the VCSEL devices that matches or corresponds to one-half of the desired center wavelength $\lambda_c$ of emission at 980 nm. In other words, the thicknesses and refractive indices of layers 945 to 923a provide an effective optical path length for the upper part of the resonant cavities equal to one half of the desired center wavelength $\lambda_c$ of emission at 980 nm. Similar to the embodiment of FIG. 8, the thicknesses and refractive indices of layers 921 to 911 provide an effective optical path length for the lower part of the resonant cavities of the VCSEL devices that corresponds to the ratio of (integer N*the desired center wavelength of emission at 980 nm) over 2. In other words, the thicknesses and refractive indices of layers 921 to 911 provide an effective optical path length for the lower part of the resonant cavities equal to $(N^*\lambda_c)/2$.

Also note that, in the embodiment of FIG. 9, the bottom mirror is formed by alternating layers of GaAs and AlAs (specifically 27.5 layer pairs) with thicknesses and refractive indices that provide an effective optical path length corresponding to one-quarter of the designed wavelength of 980 nm. In this case, oxidation of the alternating layers of GaAs and AlAs is not required. In other embodiments, the bottom mirror can be formed by growing alternating layers of GaAs and AlAs (such as 5.5 layer pairs) and performing oxidation of such layers as described herein.

Also note that the exemplary fabrication operations of FIGS. 5A to 5G as described above can be used to form a two-dimensional array of VCSEL devices realized in an integrated circuit (IC) that employs the epitaxial layer structure of FIG. 9.

FIG. 10 illustrates another exemplary layer structure utilizing group III-V materials for realizing the active device structure of FIG. 1. The layer structure of FIG. 10 can be used to define an array of VCSEL devices that emit 980 nm light as part of an integrated circuit similar to the integrated circuit described above with respect to FIGS. 3A to 3D. The layer structure of FIG. 10 can be made, for example, using known molecular beam epitaxy (MBE) or Metal-Organic Chemical Vapor Deposition (MOCVD) techniques.

Note that, in the embodiment of FIG. 10, the layers for the upper part of the resonant cavities of the VCSEL devices is similar to the layer structure of FIG. 8, but has an undoped spacer layer 1014 and an inverted p-type modulation doped QW structure (layers 1015a to layer 1015f) that substitutes for the intermediate p-type layer 815. The inverted p-type modulation doped QW structure includes a thin p+ charge sheet (layer 1015a) offset from one or more InGaAs quantum wells 1015d with GaAs barrier layers 1015c/1015e by an undoped spacer layer 1015b.

Also note that, in the embodiment of FIG. 10, the bottom mirror is formed by alternating layers of GaAs and AlAs (specifically 27.5 layer pairs) with thicknesses and refractive indices that provide an effective optical path length corresponding to one-quarter of the designed wavelength of 980 nm. In this case, oxidation of the alternating layers of GaAs and AlAs is not required. In other embodiments, the bottom mirror can be formed by growing alternating layers of GaAs and AlAs (such as 5.5 layer pairs) and performing oxidation of such layers as described herein.

Also note that, in the embodiment of FIG. 10, the thicknesses and refractive indices of layers 1045 to 1023a provide an effective optical path length for the upper part of the resonant cavities of the VCSEL devices that matches or corresponds to the desired center wavelength $\lambda_c$ of emission at 980 nm. In other words, the thicknesses and refractive indices of layers 1045 to 1023a provide an effective optical path length for the upper part of the resonant cavities equal to the desired center wavelength $\lambda_c$ of emission at 980 nm. Furthermore, the thicknesses and refractive indices of layers 1021 to 1009 provide an effective optical path length for the lower part of the resonant cavities of the VCSEL devices that corresponds to the ratio of (integer N*the desired center wavelength of emission at 980 nm) over 2. In other words, the thicknesses and refractive indices of layers 1021 to 1009 provide an effective optical path length for the lower part of the resonant cavities equal to $(N^*\lambda_c)/2$.

Also note that the exemplary fabrication operations of FIGS. 5A to 5G as described above can be used to form a two-dimensional array of VCSEL devices realized in an integrated circuit (IC) that employs the epitaxial layer structure of FIG. 10.

Figure 11:
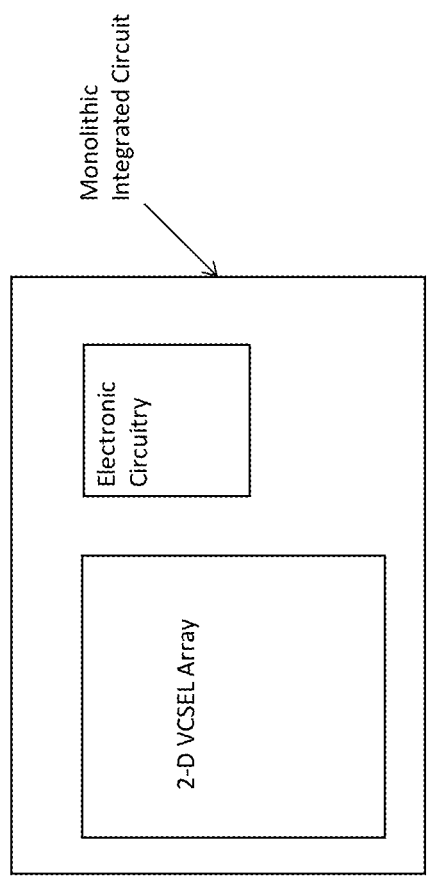
FIG. 11 is a schematic illustration of a monolithic integrated circuit that includes an array of VCSEL devices integrated with electronic circuitry.

The semiconductor layer structures as described herein can also provide for integration of electronic circuitry with the array of VCSEL devices as part of a monolithic integrated circuit as shown in FIG. 11. The electronic circuitry can provide for a wide variety of functions, such as providing the necessary electrical signals to turn ON the VCSEL devices of the array such that they operate in the forward bias operation or turn OFF the VCSEL devices of the array as needed.

Figure 12:
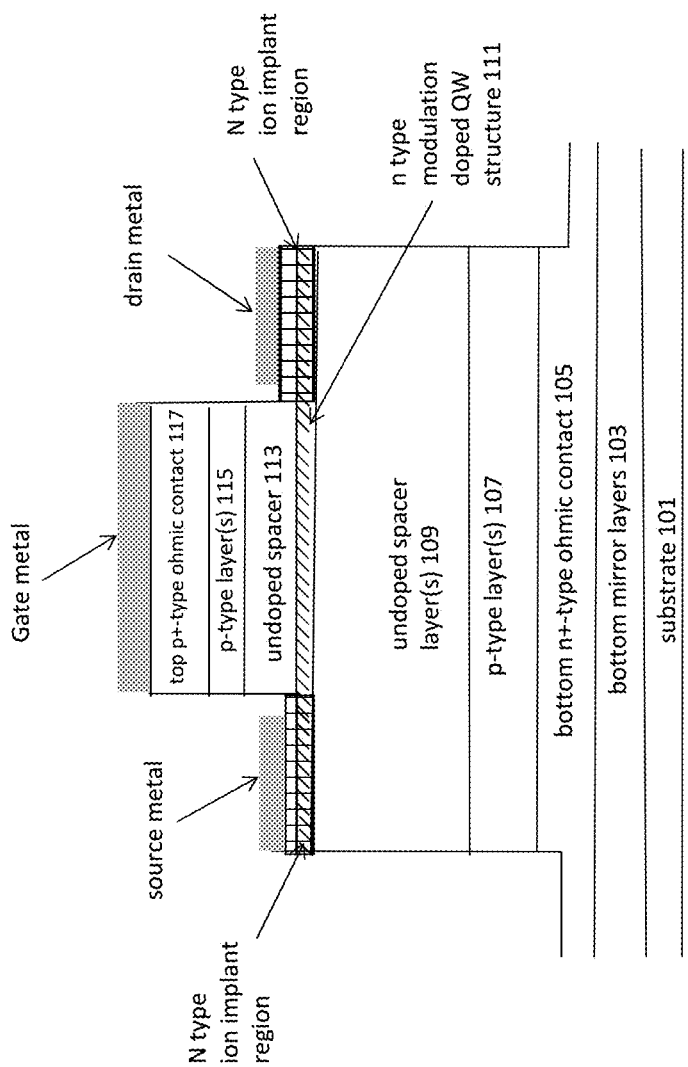
FIG. 12 is a schematic cross-sectional view of the integrated circuit of FIG. 11, which shows an n-channel HFET device which can be integrally formed with the array of VCSEL devices as described herein.

In one embodiment, the electronic circuitry of FIG. 11 can include one or more n-channel HFET devices as shown in FIG. 12. For the n-channel HFET device, a gate region (which can encompass the p-+ type ohmic contact layer(s) 117 and p-type layer(s) 115 or parts thereof) is exposed by etching away the layers that overlie the gate region, and metal for a gate terminal electrode (labeled "gate metal") of the n-channel HFET device is formed on the gate region as shown. For small-size n-channel HFET devices that incorporate AlAs material as part of the p-type layers 115, the AlAs material can be used as an etch stop for a selective wet etch operation that exposes parts of p-type layers 115 in order to define a reduced-thickness gate region under the AlAs material. Metal for a source terminal electrode (labeled "source metal") and metal for a drain terminal electrode (labeled "drain metal") of the n-channel HFET device are operably coupled via n-type ion implanted contact regions to opposite ends or sides of a QW channel(s) realized in the intermediate n-type modulation doped QW structure 111 as shown. One or more terminal electrodes (not shown) can be operably coupled to the intermediate p-type layer 107 and used as back-gate (collector) terminal electrodes for the n-channel HFET device.

In one embodiment, the electronic circuitry of FIG. 11 can include one or more p-channel HFET devices. For the p-channel HFET device, a back-gate (collector) region (intermediate spacer layer(s) 109) is exposed by etching away the layers that overlie the collector (back-gate) region. A shallow n+ type ion implant contact region can be implanted into the back-gate (collector) region. A back-gate (collector) terminal electrode can be formed on the back-gate (collector) region of the p-channel HFET device. A source terminal electrode and a drain terminal electrode of the p-channel HFET device are operably coupled via p-type ion implanted contact regions to opposite ends or sides of a QW channel(s) realized in an inverted p-type modulation doped QW structure. An example of such an inverted p-type modulation doped QW structure is described above with respect to FIG. 10. The gate region (bottom n+-type ohmic contact layer(s) 105) of the p-channel HFET device is exposed by etching away the layers that overlie the gate region. A gate electrode is formed on the bottom n+-type ohmic contact layer(s) 105 for the p-channel HFET device.

Note that both the n-channel HFET device and the p-channel HFET device are field effect transistors where current flows as a two-dimensional gas through a QW channel with contacts at either end or side. The basic transistor action is the modulation of the QW channel conductance by a modulated electric field that is perpendicular to the QW channel. The modulated electric field modulates the QW channel conductance by controlling an inversion layer (i.e., a two-dimensional electron gas for the n-channel HFET device or a two-dimensional hole gas for the p-channel HFET) as a function of gate voltage relative to source voltage.

For the n-channel HFET device, the QW channel conductance is turned ON by biasing the gate terminal electrode and the source terminal electrode at voltages where the P/N junction of the gate and source regions is forward biased with minimal gate conduction and an inversion layer of electron gas is created in the QW channel of the n-type modulation doped QW structure between the source terminal electrode and the drain terminal electrode. In this configuration, the source terminal electrode is the terminal electrode from which the electron carriers enter the QW channel of the n-type modulation doped QW structure, the drain terminal electrode is the terminal electrode where the electron carriers leave the device, and the gate terminal electrode is the control terminal for the device.

The p-channel HFET device operates in a similar manner to the n-channel HFET device with the current direction and voltage polarities reversed with respect to those of the n-channel HFET device. For the p-channel HFET device, the QW channel conductance is turned ON by biasing the gate terminal electrode and the source terminal electrode at a voltage where the P/N junction of the source and gate regions is forward-biased with minimal gate conduction and an inversion layer of hole gas is created in the QW channel of the p-type modulation doped QW structure between the source terminal electrode and the drain terminal electrode. In this configuration, the source terminal electrode is the terminal from which the hole carriers enter the QW channel of the p-type modulation doped QW structure, the drain terminal electrode is the terminal where the hole carriers leave the device, and the gate terminal electrode is the control terminal for the device.

Figure 13:
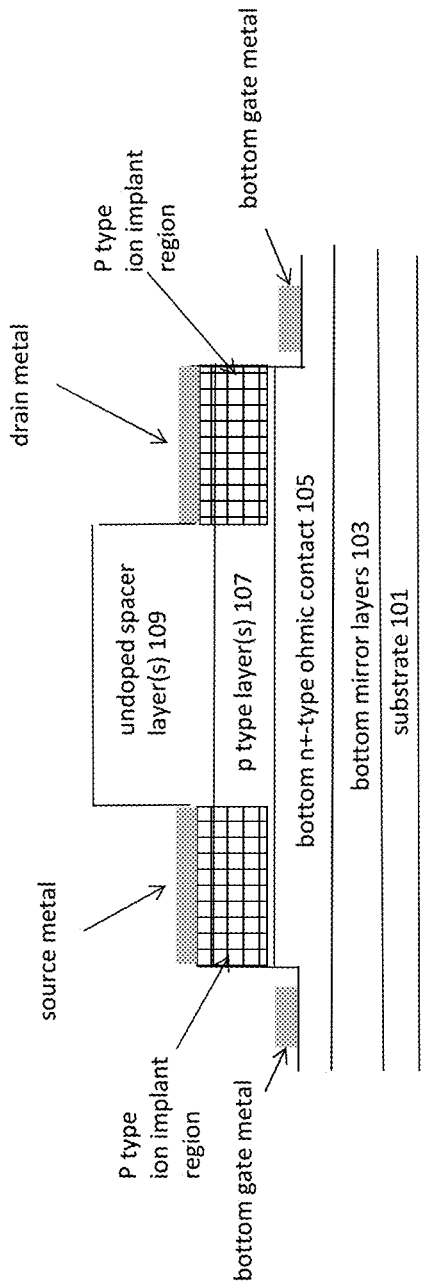
FIG. 13 is a schematic cross-sectional view of the integrated circuit of FIG. 11, which shows a p-type FET device which can integrally formed with the array of VCSEL devices as described herein.

In still another embodiment, the electronic circuitry of FIG. 11 can include an inverted p-type field-effect transistor (p-type FET) as shown in FIG. 13. For the inverted p-type FET device, a back-gate (collector) region (intermediate spacer layer(s) 109) can be exposed by etching away the layers that overlie the back-gate (collector) region. A shallow p+ type ion implant contact region (not shown) can be implanted into the back-gate (collector) region. Metal for a back-gate (collector) terminal electrode (not shown) can be formed on the back-gate (collector) region of the inverted p-type FET device. Metal for a source terminal electrode (labeled "Source Metal") and metal for a drain terminal electrode (labeled "Drain Metal") of the inverted p-type FET device are operably coupled via p-type ion implanted contact regions to opposite ends or sides of a channel(s) formed in the intermediate p-type layer(s) 107 as shown. The gate region (bottom n+-type ohmic contact layer(s) 105) of the inverted p-type FET device underlies this channel and is exposed by etching away the layers that overlie the gate region. Metal for a gate electrode (labeled "Bottom gate metal") is formed on the bottom n+-type ohmic contact layer(s) 105 for the inverted p-channel HFET device as shown.

The inverted p-type FET device is a field effect transistor where current flows through the channel formed in the intermediate p-type layer(s) 107 with contacts at either end or side. The basic transistor action is the modulation of the channel conductance by a modulated electric field that is perpendicular to the channel. The modulated electric field modulates the channel conductance by controlling an inversion layer of holes as a function of gate voltage relative to source voltage. Specifically, the channel conductance is turned ON by biasing the gate terminal electrode and the source terminal electrode at a voltage where the P/N junction of the source and gate regions is forward-biased with minimal gate conduction and an inversion layer of holes is created in the channel formed in the intermediate p-type layer(s) 107 between the source terminal electrode and the drain terminal electrode. In this configuration, the source terminal electrode is the terminal from which the hole carriers enter the channel, the drain terminal electrode is the terminal where the hole carriers leave the device, and the gate terminal electrode is the control terminal for the device.

The device structures of the present application can also be configured to realize bipolar inversion channel field-effect transistors (BICFETs) with either an n-type modulation doped quantum well inversion channel base region (n-channel base BICFET) or a p-type modulation doped quantum well inversion channel base region (p-channel base BICFET).

Figure 14A:
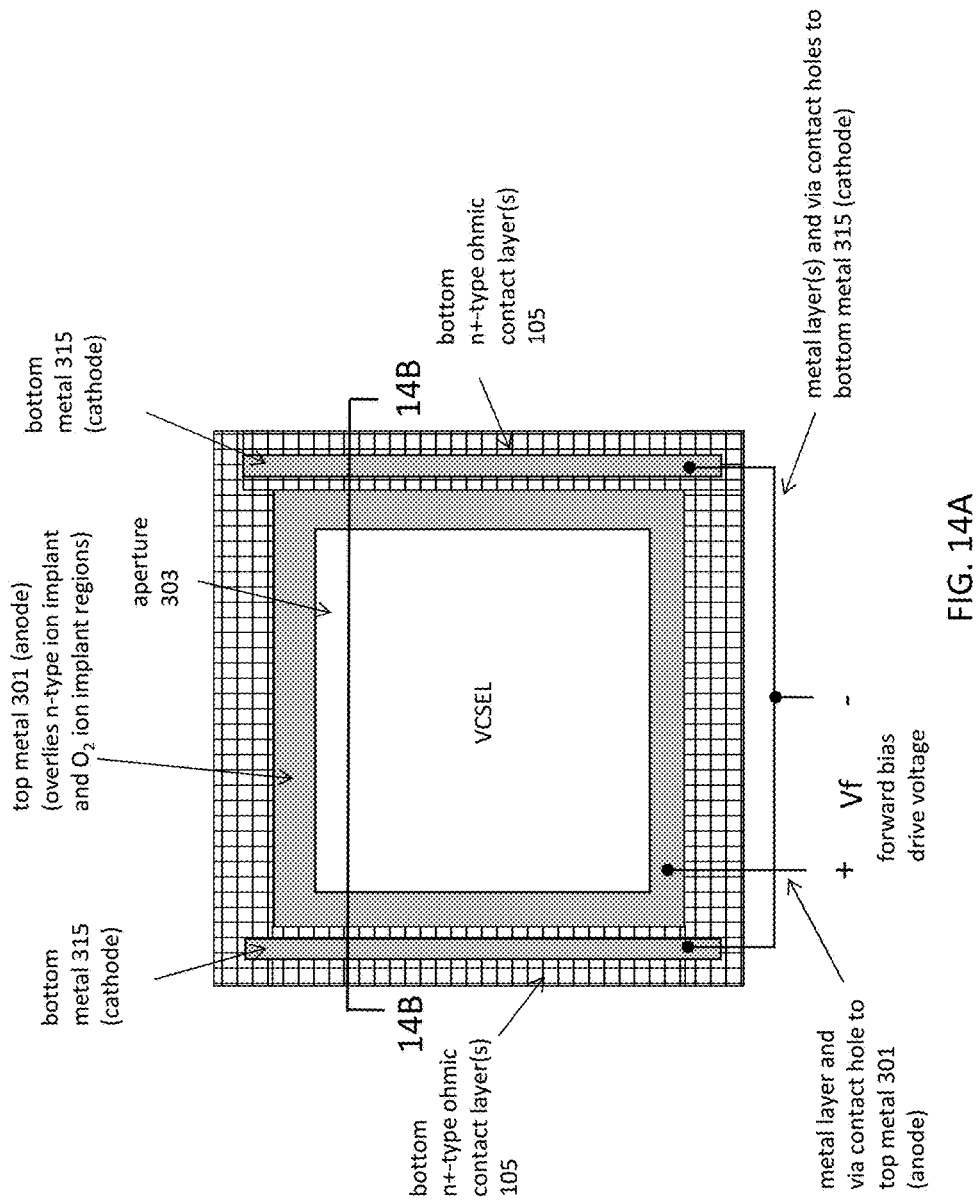
FIG. 14A is a top schematic view of an integrated circuit that includes a single VCSEL device realized from the layer structure of FIG. 1.
Figure 14B:
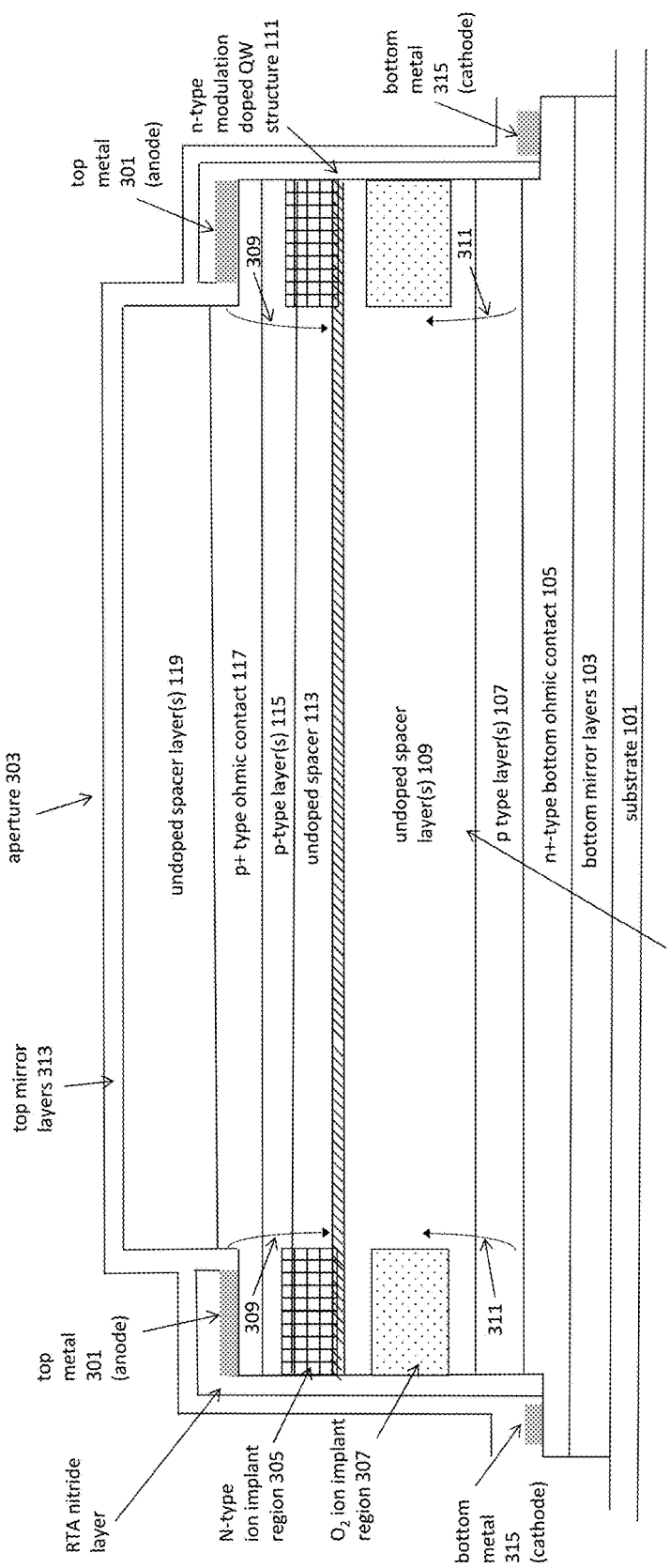
FIG. 14B is a schematic cross-sectional view of the integrated circuit of FIG. 14A, which includes a single VCSEL device realized from the layer structure of FIG. 1.

FIGS. 14A and 14B illustrate an integrated circuit that includes a single VCSEL device formed from the epitaxial layer structure of FIG. 1. As best shown in FIG. 14A, a patterned top metal layer 301 that realizes an anode terminal for the VCSEL device surrounds an aperture 303. The aperture 303 allow light that propagates in the resonant cavity of the VCSEL device to exit therefrom for emission from the integrated circuit. The patterned top metal layer 301 is formed on the top p+-type ohmic contact layer(s) 117 as shown in FIG. 14B. The VCSEL device has an active optical region formed by the n-type modulation doped QW structure 111 disposed below the aperture 303 of the VCSEL device.

The patterned top metal layer 301 also overlies an N-type ion implant region 305 and an oxygen ($O_2$) ion implant region 307 that surround the VCSEL device as best shown in FIG. 14B. In one embodiment, the $O_2$ ion implant region 307 can be formed such that it extends vertically through at least part of the undoped spacer layer(s) 109 as shown. The N-type ion implant region 305 can be formed above the $O_2$ ion implant region 307 such that it extends vertically through at least part of the p-type layer(s) 115, completely through the undoped spacer layer(s) 113, and through at least part of the n-type modulation doped QW structure 111 as shown. In this manner, the N-type ion implant region 305 and the $O_2$ ion implant region 307 are formed above and below the respective active region of the VCSEL device. The N-type ion implant region 305 and the $O_2$ ion implant region 307 are subject to high temperature thermal anneal operations (for example, at temperatures at or above 850° C.), which activate and anneal these ion implant regions 305, 307. The N-type ion implant region 305 and the $O_2$ ion implant region 307 can be distributed in a Gaussian manner in the layer structure as is well known, which is not shown for the sake of simplicity. The activated and annealed N-type ion implant region 305 provides a P-N junction potential barrier that confines and funnels (concentrates) hole current that flows from the top metal anode 301 into the active optical region of the VCSEL device during forward biased operation, which is depicted graphically by arrows 309. The activated and annealed $O_2$ ion implant region 307 provides a high resistance current blocking barrier that confines and funnels (concentrates) electron current that flows from the J2 junction of the intermediate p-type layer(s) 107 and the bottom n+-type ohmic contact layer(s) 105 into the active optical region of the VCSEL device during forward biased operation, which is depicted graphically by arrows 311. Electron current can also flow backward from the active optical region to the J2 junction of the intermediate p-type layer(s) 107 and bottom n+-type ohmic contact layer(s) 105 of the VCSEL device during forward biased operation. Hole current can also flow backward from the active optical regions to the J1 junction of the thin n+ type charge sheet of the n-type modulation doped structure and the top p+-type region of the VCSEL device during forward biased operation. The activated and annealed implant regions 305, 307 also provide refractive index changes that aid in lateral confinement of light within the vertical resonant cavity of the VCSEL device defined between the bottom mirror layers 103 and top mirror layers 313 as best shown in FIG. 14B.

A patterned bottom metal layer 315 that realizes a two-part cathode terminal for the VCSEL device is formed on the bottom n+-type ohmic contact layer(s) 105 on opposite sides of the VCSEL device as shown. A forward bias drive voltage $V_f$ is applied across the anode 310 and the two-part common cathode 315, for example by metal layers and corresponding via contact holes, as shown in FIG. 14A. The forward bias drive voltage $V_f$ is configured such that it turns ON the diode-like VCSEL device (for example, with a forward bias of greater than 1.5 volts). In this ON state, the VCSEL device conducts current from the anode to the cathode, which injects current into the active optical region of the VCSEL device. The electron and hole current injected into the active optical region of the VCSEL device produces stimulated emission of light (photons) that resonates within the vertical resonant cavity of the VCSEL device and that is emitted from the aperture 303 of the VCSEL device. In some embodiments, the optical power of the light emitted from the aperture 303 of the VCSEL device can be controlled by controlling the magnitude of the forward bias drive voltage $V_f$.

In other configurations, the drive voltage $V_f$ can be configured such that it turns OFF the diode-like VCSEL device (for example, with a bias of zero volts or other voltage less than 1.5 volts). In this OFF state, the VCSEL device does not conduct current from the anode to the cathode, and the VCSEL device does not produce stimulated emission of light (photons) within the vertical resonant cavity of the VCSEL device nor emission of light from the aperture 303 of the VCSEL device.

The diode-like VCSEL device can be configured such that, under application of the forward bias drive voltage $V_f$, the VCSEL device produces a single mode output with continuous wave (CW) operation.

Note that the activated and annealed oxygen ion implant region 307 can function to confine and funnel (concentrates) electron current from the J2 junction of the intermediate p-type region and the bottom n+-type region to the active optical region of the VCSEL device, which aids in producing stimulated emission of light in the active region of the VCSEL device. The activated and annealed oxygen ion implant region 307 can also provide a refractive index change that can aid in lateral confinement of light within the vertical resonant cavity of the VCSEL device defined between the bottom mirror layers and top mirror layers.

Furthermore, the semiconductor layer structures as described herein can also provide for integration of electronic circuitry with the VCSEL device as part of a monolithic integrated circuit. The electronic circuitry can provide for a wide variety of functions, such as providing the necessary electrical signals to turn ON the VCSEL device such that it operates in the forward bias operation or turn OFF the VCSEL device as needed. Such integrated electronic circuitry can include the n-channel HFET device of FIG. 12, the inverted p-type field-effect transistor (p-type FET) of FIG. 13 or other transistor devices.

Variations

In alternate embodiments, the VCSEL devices of the array as described herein can be laid out in other two-dimensional arrangements, such as non-linear arrangements that fill a circular, semi-circular, or hexagonal area.

In yet other embodiments, etch stop layers (such as AlAs etch stop layers) can be incorporated into the layer structures as described herein in order to facilitate selective etching operations (such as selective wet etching in citric acid and BHF) that expose desired parts of the layer structures. For example, a thin AlAs etch stop layer may be integrated into the layer structure at vertical position where the source and drain metal of the n-channel HFET device are desired to be deposited. In another example, a thin AlAs etch stop layer may be integrated into the layer structure at vertical position where the contact to the back-gate (collector) of the inverted p-type FET device is desired to be deposited. This will establish the height of the mesa for the back-gate (collector) region of the inverted p-type FET device and control the short channel effect of the inverted p-type FET device. The mesa height should be no more than 3× the channel length of the inverted p-type FET device. Therefore, this etch stop can be useful for short channel devices. These AlAs etch stop layers can be approached with a dry etch to within 200-500 Å. Then wet etching in citric acid can be used to reach and stop at the AlAs etch stop layer. Then, remaining parts of the exposed AlAs etch stop layer can be removed by BHF.

There have been described and illustrated herein several embodiments of methods for forming optoelectronic integrated circuits employing complementary modulation doped quantum well structures. While particular embodiments of the invention have been described, it is not intended that the invention be limited thereto, as it is intended that the invention be as broad in scope as the art will allow and that the specification be read likewise. Thus, while particular group III-V material system and heterostructures have been disclosed, it will be appreciated that other III-V material systems and heterostructures can be used to realize the optoelectronic integrated circuitry as described herein. It will therefore be appreciated by those skilled in the art that yet other modifications could be made to the provided invention without deviating from its spirit and scope as claimed.

What is claimed is:

1. A semiconductor device comprising:
a plurality of vertical-cavity surface-emitting laser (VCSEL) devices arranged in a two-dimensional array, wherein the plurality of VCSEL devices is formed from a layer structure that includes at least one bottom n-type layer, at least one intermediate p-type layer formed above the at least one bottom n-type layer, an n-type modulation doped quantum well structure formed above the at least one intermediate p-type layer, at least one spacer layer formed between the at least one intermediate p-type layer and the n-type modulation doped quantum well structure, and at least one top p-type layer formed above the n-type modulation doped quantum well structure;
an annealed oxygen implant region disposed vertically in the layer structure within the at least one spacer layer and configured to surround and extend laterally in a continuous manner between the plurality of VCSEL devices;
an annealed n-type ion implant region disposed vertically in the layer structure within the top p-type spacer layer and configured to overlie the annealed oxygen implant region and surround and extend laterally in a continuous manner between the plurality of VCSEL devices;
a common anode that contacts the at least one top p-type layer; and
a common cathode that contacts the at least one bottom n-type layer;
wherein the at least one intermediate p-type layer has a built-in hole charge $Q_p$, the at least one bottom n-type layer has a built-in electron charge $Q_n$, and the built-in hole charge $Q_p$ relative to the built-in electron charge $Q_n$ is configured for diode current-voltage characteristics of the plurality of VCSEL devices based on voltages applied to the common anode and the common cathode.

2. The semiconductor device of claim 1, wherein:
the annealed oxygen implant region is annealed at a temperature greater than 800° C.

3. The semiconductor device of claim 1, wherein:
the common anode overlies both the annealed n-type ion implant region and the annealed oxygen implant region.

4. The semiconductor device of claim 1, wherein:
the plurality of VCSEL devices have respective active optical regions; and
both the annealed n-type ion implant region and the annealed oxygen implant region each provide a high resistance region that confines and funnels current into the respective active optical regions of the plurality of VCSEL devices.

5. The semiconductor device of claim 4, wherein:
both the annealed oxygen implant region and the annealed n-type ion implant region provide current isolation between the plurality of VCSEL devices and refractive index changes that aid in lateral confinement of light within vertical resonant cavities of the plurality of VCSEL devices while avoiding an isolation etch between the plurality of VCSEL devices.

6. The semiconductor device of claim 1, wherein:
the annealed n-type ion implant region and the annealed oxygen implant region are defined using a common implant mask.

7. The semiconductor device of claim 1, wherein:
the n-type modulation doped quantum well structure includes a n-type charge sheet offset from at least one quantum well, and the n-type modulation doped quantum well structure defines respective active optical regions for the plurality of VCSEL devices.

8. The semiconductor device of claim 1, wherein:
the built-in hole charge $Q_p$ is dictated by at least one of p-type dopant concentration and thickness of the at least one intermediate p-type layer; and
the built-in electron charge $Q_n$ is dictated by at least one of n-type dopant concentration and thickness of the least one bottom n-type layer.

9. The semiconductor device of claim 1, wherein:
the layer structures is formed on a substrate.

10. The semiconductor device of claim 9, wherein:
the layer structure further includes a plurality of bottom mirror layers formed on the substrate below the at least one bottom n-type layer, wherein the bottom mirror layers define resonant cavities for the plurality of VCSEL devices.

11. The semiconductor device of claim 10, wherein:
the bottom mirror layers comprise aluminum arsenide that is subjected to oxidation that converts the aluminum arsenide to aluminum oxide.

12. The semiconductor device of claim 10, wherein:
the resonant cavities for the plurality of VCSEL devices are further defined by a plurality of top mirror layers formed by deposition.

13. The semiconductor device of claim 1, wherein:
the layer structure further includes at least one undoped spacer layer formed above the top p-type layer that is used to define respective apertures for the plurality of VCSEL devices.

14. The semiconductor device of claim 13, wherein:
metal that forms the common anode as well as the at least one undoped spacer layer formed above the top p-type layer are both etched away as part of an etch operation that defines the respective apertures for the plurality of VCSEL devices.

15. The semiconductor device of claim 1, wherein:
lateral spacing between apertures of the plurality of VCSEL devices of the array is 3 μm or less.

16. The semiconductor device of claim 1, wherein:
the plurality of VCSEL devices of the array experience mode-coupling that produces a coherent single mode output with continuous wave (CW) operation.

17. The semiconductor device of claim 16, wherein:
the coherent single mode output has a dominant single lobe far field pattern.

18. The semiconductor device of claim 1, further comprising:
electronic circuitry integrally formed with the array of VCSEL devices.

19. The semiconductor device of claim 18, wherein:
the electronic circuitry comprises at least one of an n-channel HFET device, an inverted P-type FET device, and a p-channel HFET device.

20. A semiconductor device comprising:
at least one vertical-cavity surface-emitting laser (VCSEL) device formed from a layer structure that includes at least one bottom n-type layer, at least one intermediate p-type layer formed above the at least one bottom n-type layer, an n-type modulation doped quantum well structure formed above the at least one intermediate p-type layer, at least one spacer layer formed between the at least one intermediate p-type layer and the n-type modulation doped quantum well structure, and at least one top p-type layer formed above the n-type modulation doped quantum well structure;
an annealed oxygen implant region disposed vertically in the layer structure within the at least one spacer layer and configured to surround the VCSEL device;
an annealed n-type ion implant region disposed vertically in the layer structure within the top p-type spacer layer and configured to overlie the annealed oxygen implant region and surround the VCSEL device;
an anode that contacts the at least one top p-type layer; and
a cathode that contacts the at least one bottom n-type layer;
wherein the at least one intermediate p-type layer has a built-in hole charge $Q_p$, the at least one bottom n-type layer has a built-in electron charge $Q_n$, and the built-in hole charge $Q_p$ relative to the built-in electron charge $Q_n$ is configured for diode current-voltage characteristics of the VCSEL device based on voltages applied to the anode and the cathode.

21. The semiconductor device of claim 20, wherein:
the annealed oxygen implant region is annealed at a temperature greater than 800° C.

22. The semiconductor device of claim 20, wherein:
the anode overlies both the annealed n-type ion implant region and the annealed oxygen implant region.

23. The semiconductor device of claim 22, wherein:
the n-type modulation doped quantum well structure includes a n-type charge sheet offset from at least one quantum well, and the n-type modulation doped quantum well structure defines an active optical region for the VCSEL device.

24. The semiconductor device of claim 23, wherein:
the VCSEL device produces a coherent single mode output with continuous wave (CW) operation.

25. The semiconductor device of claim 20, wherein:
the VCSEL device has an active optical region; and
both the annealed n-type ion implant region and the annealed oxygen implant region each provide a high resistance region that confines and funnels current into the active optical region of the VCSEL device.

26. The semiconductor device of claim 20, wherein:
the annealed n-type ion implant region and the annealed oxygen implant region are defined using a common implant mask.

27. The semiconductor device of claim 20, wherein:
the built-in hole charge $Q_p$ is dictated by at least one of p-type dopant concentration and thickness of the at least one intermediate p-type layer; and
the built-in electron charge $Q_n$ is dictated by at least one of n-type dopant concentration and thickness of the least one bottom n-type layer.

28. The semiconductor device of claim 20, wherein:
the layer structure is formed on a substrate.

29. The semiconductor device of claim 28, wherein:
the layer structure further includes a plurality of bottom mirror layers formed on the substrate below the at least one bottom n-type layer, wherein the bottom mirror layers define a resonant cavity for the VCSEL device.

30. The semiconductor device of claim 29, wherein:
the bottom mirror layers comprise aluminum arsenide that is subjected to oxidation that converts the aluminum arsenide to aluminum oxide.

31. The semiconductor device of claim 29, wherein:
the resonant cavity of the VCSEL device is further defined by a plurality of top mirror layers formed by deposition.

32. The semiconductor device of claim 20, wherein:
the layer structure further includes at least one undoped spacer layer formed above the top p-type layer that is used to define an aperture for the VCSEL device.

33. The semiconductor device of claim 32, wherein:
metal that forms the anode as well as the at least one undoped spacer layer formed above the top p-type layer are both etched away as part of an etch operation that defines the aperture for the VCSEL device.

34. The semiconductor device of claim 20, further comprising:
electronic circuitry integrally formed with the VCSEL device.

35. The semiconductor device of claim 34, wherein:
the electronic circuitry comprises at least one of an n-channel HFET device, an inverted P-type FET device, and a p-channel HFET device.

* * * * *